US012740150B2

(12) United States Patent
Zou et al.

(10) Patent No.: US 12,740,150 B2

(45) Date of Patent: Sep. 15, 2026

(54) INTEGRATION OF STACKED LOGIC DEVICE WITH PASSIVE DEVICE

(71) Applicant: INTERNATIONAL BUSINESS MACHINES CORPORATION, Armonk, NY (US)

(72) Inventors: Lijuan Zou, Slingerlands, NY (US); Tao Li, Slingerlands, NY (US); Ruilong Xie, Niskayuna, NY (US); Anthony I. Chou, Guilderland, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 373 days.

(21) Appl. No.: 18/450,445

(22) Filed: Aug. 16, 2023

(65) Prior Publication Data

US 2025/0063817 A1 Feb. 20, 2025

(51) Int. Cl.

| | |
|---|---|
| ***H10D 86/60*** | (2025.01) |
| ***H10D 86/01*** | (2026.01) |
| ***H10D 86/40*** | (2025.01) |

(52) U.S. Cl.

CPC ......... *H10D 86/60* (2025.01); *H10D 86/0214* (2025.01); *H10D 86/0221* (2025.01); *H10D 86/441* (2025.01); *H10D 86/481* (2025.01)

(58) Field of Classification Search

CPC ............... H10D 86/60; H10D 86/0214; H10D 86/0221; H10D 86/441; H10D 86/481; H10D 30/0198; H10D 64/251; H10D 84/0149; H10D 84/0151; H10D 84/811; H10D 88/00; H10D 88/01; H10D 30/501; H10D 64/017; H10D 84/832; H10D 30/6757; H10D 30/6735; H01L 21/76897; H01L 23/5286; B82Y 10/00

See application file for complete search history.

(56) References Cited

U.S. PATENT DOCUMENTS

| | | | |
|---|---|---|---|
| 3,922,707 | A | 11/1975 | Freed |
| 9,847,391 | B1 | 12/2017 | Zang |
| 10,504,890 | B2 | 12/2019 | Cheng |
| 11,101,374 | B1 | 8/2021 | Reznicek |

(Continued)

OTHER PUBLICATIONS

Pending U.S. Appl. No. 17/652,113, filed Feb. 23, 20222, entitled: "Self-Aligned Backside Contact Integration for Transistors", 59 pages.

*Primary Examiner* — Mohammad A Rahman

(74) *Attorney, Agent, or Firm* — Yuanmin Cai

(57) ABSTRACT

Embodiments of present invention provide a semiconductor structure. The structure includes an active device region and a passive device region, the active device region and the passive device region being separated by a single diffusion break, where the passive device region includes a first passive device. The first passive device includes a first diffusion region and a second diffusion region, the first and the second diffusion region being vertically connected by a lightly doped region, where the first diffusion region is connected to a backside power distribution network through a first direct backside contact (BSCA) and the second diffusion region is connected to a back-end-of-line (BEOL) structure through a first middle-of-line contact. A method of forming the same is also provided.

20 Claims, 23 Drawing Sheets

(56) References Cited

U.S. PATENT DOCUMENTS

| | | | | |
|---|---|---|---|---|
| 11,626,719 | B2 | 4/2023 | Yeh | |
| 12,243,913 | B2 | 3/2025 | Jain et al. | |
| 2022/0310638 | A1 | 9/2022 | Cheng | |
| 2022/0415880 | A1 | 12/2022 | Kar | |
| 2023/0087444 | A1 | 3/2023 | Thomson | |
| 2023/0088578 | A1 | 3/2023 | Thomson | |
| 2023/0110825 | A1 | 4/2023 | Zhou | |
| 2023/0131382 | A1* | 4/2023 | Ding | H10D 84/038 257/211 |

* cited by examiner 10
300
200
102
103
101
801
802
3001
3002
3003
3004
4211
4212
4213
411
410
409
4011
4012
4013
4014
311
313
312
306
211
213
212
206

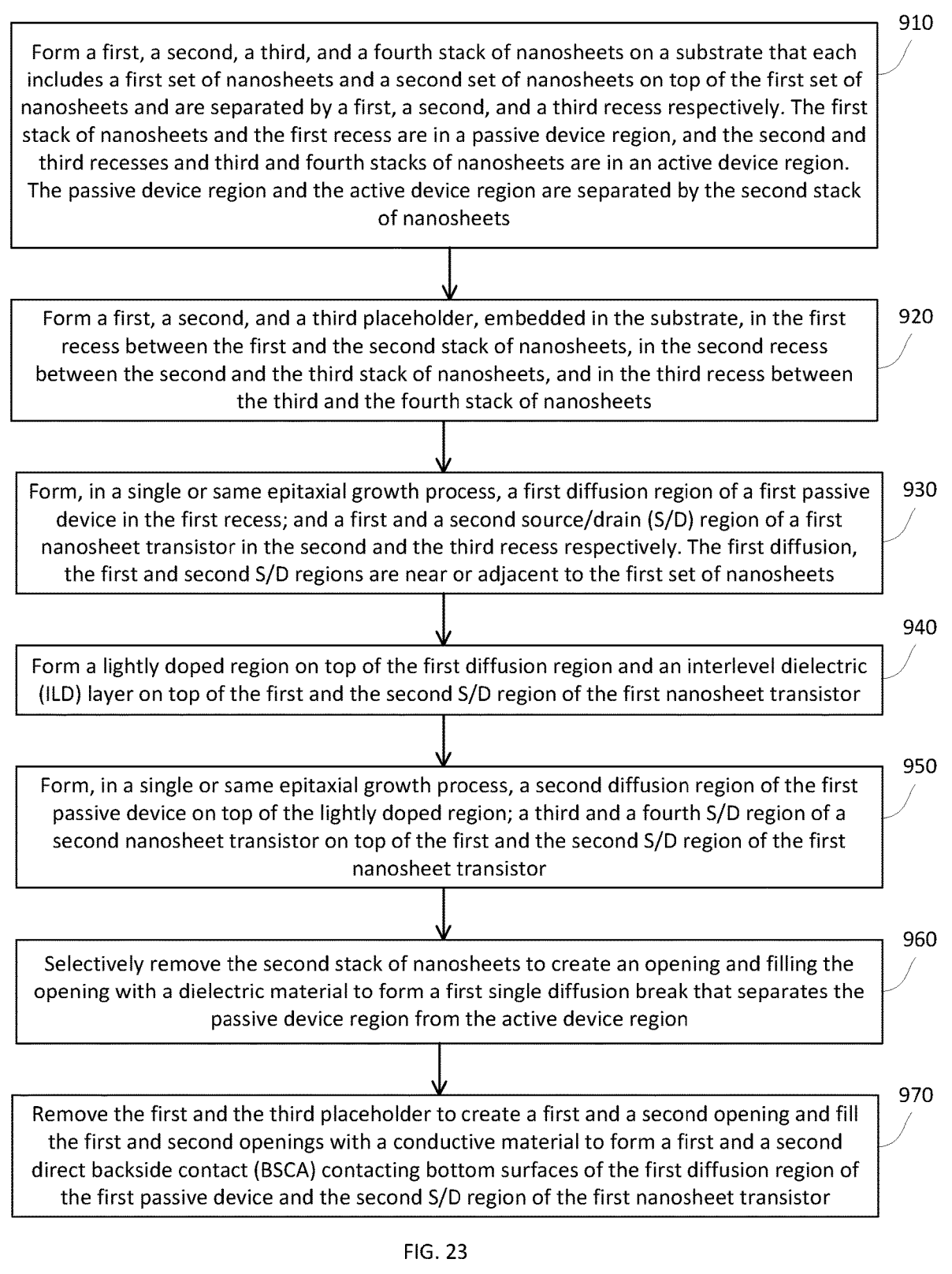

910
Form a first, a second, a third, and a fourth stack of nanosheets on a substrate that each includes a first set of nanosheets and a second set of nanosheets on top of the first set of nanosheets and are separated by a first, a second, and a third recess respectively. The first stack of nanosheets and the first recess are in a passive device region, and the second and third recesses and third and fourth stacks of nanosheets are in an active device region. The passive device region and the active device region are separated by the second stack of nanosheets 920
Form a first, a second, and a third placeholder, embedded in the substrate, in the first recess between the first and the second stack of nanosheets, in the second recess between the second and the third stack of nanosheets, and in the third recess between the third and the fourth stack of nanosheets 930
Form, in a single or same epitaxial growth process, a first diffusion region of a first passive device in the first recess; and a first and a second source/drain (S/D) region of a first nanosheet transistor in the second and the third recess respectively. The first diffusion, the first and second S/D regions are near or adjacent to the first set of nanosheets 940
Form a lightly doped region on top of the first diffusion region and an interlevel dielectric (ILD) layer on top of the first and the second S/D region of the first nanosheet transistor 950
Form, in a single or same epitaxial growth process, a second diffusion region of the first passive device on top of the lightly doped region; a third and a fourth S/D region of a second nanosheet transistor on top of the first and the second S/D region of the first nanosheet transistor 960
Selectively remove the second stack of nanosheets to create an opening and filling the opening with a dielectric material to form a first single diffusion break that separates the passive device region from the active device region 970
Remove the first and the third placeholder to create a first and a second opening and fill the first and second openings with a conductive material to form a first and a second direct backside contact (BSCA) contacting bottom surfaces of the first diffusion region of the first passive device and the second S/D region of the first nanosheet transistor

FIG. 23

INTEGRATION OF STACKED LOGIC DEVICE WITH PASSIVE DEVICE

BACKGROUND

The present application relates to manufacturing of semiconductor integrated circuits. More particularly, it relates to an integrated process of manufacturing stacked logic device with passive device and the structure formed thereby.

As semiconductor industry moves towards smaller node, for example 7-nm node and beyond, field-effect-transistors (FETs) are aggressively scaled to fit into reduced footprint or real estate with increased device density. For example, nanosheet based FETs may be stacked together to double the device density. In addition, backside power distribution network (BSPDN) is introduced to further improve the usage of both frontside and backside real estate of the device chip with more robust signal routing and power distribution.

Moreover, passive devices such as, for example, diodes may be integrated with active devices such as, for example, FETs on a same semiconductor chip for enhanced functionality. However, a process of co-integration is needed in order to take advantage of currently existing process of manufacturing active devices, therefore reducing potential added complexity for the sake of integrating passive devices with active devices.

SUMMARY

Embodiments of present invention provide a semiconductor structure. The structure includes an active device region and a passive device region, the active device region and the passive device region being separated by a single diffusion break, where the passive device region includes a first passive device. The first passive device includes a first diffusion region and a second diffusion region, the first and the second diffusion region being vertically connected by a doped region, where the first diffusion region is connected to a backside power distribution network (BSPDN) through a first direct backside contact (BSCA) and the second diffusion region is connected to a back-end-of-line (BEOL) structure through a first middle-of-line (MOL) contact.

In one embodiment, the active device region includes a first nanosheet transistor with a first and a second source/drain (S/D) region and includes a second nanosheet transistor with a third and a fourth S/D region, the third and the fourth S/D region of the second nanosheet transistor being separated from the first and the second S/D region, respectively, of the first nanosheet transistor by a first interlevel dielectric (ILD) layer.

In another embodiment, a top surface of the first diffusion region of the first passive device is substantially co-planar with a top surface of the first S/D region of the first nanosheet transistor and the first diffusion region is made of a substantially same material as the first S/D region of the first nanosheet transistor.

In yet another embodiment, a top surface of the second diffusion region of the first passive device is substantially co-planar with a top surface of the third S/D region of the second nanosheet transistor and the second diffusion region is made of a substantially same material as the third S/D region of the second nanosheet transistor.

In one embodiment, the first S/D region of the first nanosheet transistor and the third S/D region of the second nanosheet transistor are connected to the BEOL structure by a second MOL contact, and the fourth S/D region of the second nanosheet transistor is connected to the BEOL structure by a third MOL contact.

In another embodiment, the active device region includes a placeholder underneath the first S/D region of the first nanosheet transistor, and the second S/D region of the first nanosheet transistor is connected to the BSPDN through a second direct BSCA.

According to one embodiment, the single diffusion break has a first side near the first S/D region of the first nanosheet transistor and near the third S/D region of the second nanosheet transistor and has a second side near the first passive device.

In one embodiment, the first diffusion region of the first passive device includes a p-type dopant, and the second diffusion region of the first passive device includes an n-type dopant.

In one embodiment, the single diffusion break is a first single diffusion break, and the structure further includes a second single diffusion break in the passive device region, where the first passive device has a first side near the first single diffusion break and a second side near the second single diffusion break.

Embodiments of present invention further provide a method of forming a semiconductor structure. The method includes forming a first, a second, a third, and a fourth stack of nanosheets on a substrate, where the first, the second, the third, and the fourth stack of nanosheets each includes a first set of nanosheets and a second set of nanosheets on top of the first set of nanosheets and are separated by a first, a second, and a third recess respectively; the first stack of nanosheets and the first recess are in a passive device region; the second recess, the third stack of nanosheets, the third recess, and the fourth stack of nanosheets are in an active device region; and the passive device region and the active device region are separated by the second stack of nanosheets; forming a first diffusion region of a first passive device in the first recess; a first source/drain (S/D) region of a first nanosheet transistor in the second recess; and a second S/D region of the first nanosheet transistor in the third recess, wherein the first diffusion and the first and the second S/D region are adjacent to the first set of nanosheets; forming a lightly doped region on top of the first diffusion region and an interlevel dielectric (ILD) layer on top of the first and the second S/D region of the first nanosheet transistor; and forming a second diffusion region of the first passive device on top of the lightly doped region; a third S/D region of a second nanosheet transistor on top of the first S/D region of the first nanosheet transistor; and a fourth S/D region of the second nanosheet transistor on top of the second S/D region of the first nanosheet transistor.

In one embodiment, the first diffusion region and the first and the second S/D region of the first nanosheet transistor are formed through a first epitaxial growing process, and the second diffusion region and the third and the fourth S/D region are formed through a second epitaxial growing process.

According to one embodiment, the method further includes selectively removing the second stack of nanosheets to create an opening and subsequently filling the opening with a dielectric material to form a first single diffusion break that separates the passive device region from the active device region.

According to another embodiment, the method further includes forming a first, a second, and a third placeholder in the first recess between the first and the second stack of nanosheets, in the second recess between the second and the third stack of nanosheets, and in the third recess between the third and the fourth stack of nanosheets, the first, the second, and the third placeholder being embedded in the substrate.

According to yet another embodiment, the method further includes forming a first and a second direct backside contact (BSCA) from a backside of the substrate by removing the first and the third placeholder underneath the first diffusion region and the second S/D region of the first nanosheet transistor to create a first and a second opening and filling the first and the second opening with a conductive material to form the first and the second direct BSCA.

According to one embodiment, the method further includes forming a first, a second, and a third middle-of-line (MOL) contact, wherein the first MOL contact contacting the second diffusion region of the first passive device, the second MOL contact contacting both the first S/D region of the first nanosheet transistor and the third S/D region of the second nanosheet transistor, and the third MOL contact contacting the fourth S/D region of the second nanosheet transistor.

According to another embodiment, the method further includes replacing the first and the second set of nanosheets of the third stack of nanosheets with a gate metal in a replacement-metal-gate (RMG) process.

BRIEF DESCRIPTION OF THE DRAWINGS

The present invention will be understood and appreciated more fully from the following detailed description of embodiments of present invention, taken in conjunction with accompanying drawings of which:

FIG. 23 is a demonstrative illustration of a flow-chart of a method of manufacturing a semiconductor structure according to embodiments of present invention.

Figure 1:
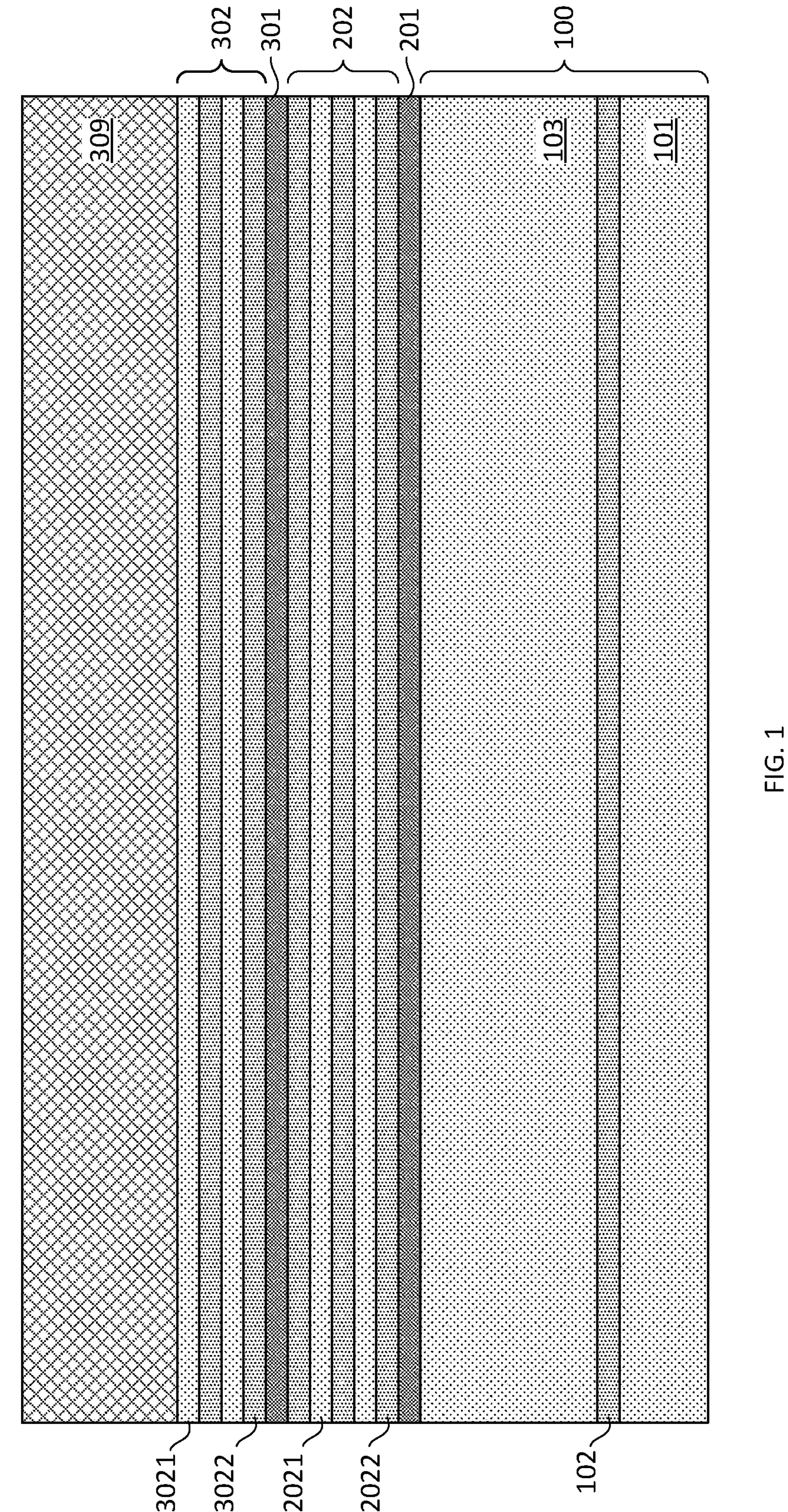
FIGS. 1-22 are demonstrative illustrations of cross-sectional views of a semiconductor structure at various steps of manufacturing thereof according to embodiments of present invention.

It will be appreciated that for simplicity and clarity purpose, elements shown in the drawings have not necessarily been drawn to scale. Further, and if applicable, in various functional block diagrams, two connected devices and/or elements may not necessarily be illustrated as being connected. In some other instances, grouping of certain elements in a functional block diagram may be solely for the purpose of description and may not necessarily imply that they are in a single physical entity, or they are embodied in a single physical entity.

DETAILED DESCRIPTION

In the below detailed description and the accompanying drawings, it is to be understood that various layers, structures, and regions shown in the drawings are both demonstrative and schematic illustrations thereof that are not drawn to scale. In addition, for the ease of explanation, one or more layers, structures, and regions of a type commonly used to form semiconductor devices or structures may not be explicitly shown in a given illustration or drawing. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error may be present such as, by way of example only, 1% or less than the stated amount. Likewise, the terms "on", "over", or "on top of" that are used herein to describe a positional relationship between two layers or structures are intended to be broadly construed and should not be interpreted as precluding the presence of one or more intervening layers or structures.

Moreover, although various reference numerals may be used across different drawings, the same or similar reference numbers are used throughout the drawings to denote the same or similar features, elements, or structures, and thus detailed explanations of the same or similar features, elements, or structures may not be repeated for each of the drawings for economy of description. Labelling for the same or similar elements in some drawings may be omitted as well in order not to overcrowd the drawings.

FIG. 1 is a demonstrative illustration of cross-sectional view of a semiconductor structure in a step of manufacturing thereof according to one embodiment of present invention. Specifically, the semiconductor structure includes one or more active devices such as transistors, and one or more passive devices such as diodes. FIG. 1 illustrates a cross-sectional view with the cross-section made across gates of the one or more transistors in a direction along the length of the gates. FIGS. 2-22 illustrate views of similar cross-sections, that is, cross-sections made across the gates of the one or more transistors in a direction along the length of the gates at other steps of manufacturing of the semiconductor device.

Embodiments of present invention provide forming a semiconductor structure 10 by providing or receiving a semiconductor substrate 100. The semiconductor substrate 100 may include a silicon (Si) substrate 101, an etch-stop layer 102 on top of the Si substrate 101, and a Si layer 103 on top of the etch-stop layer 102. In one embodiment, the etch-stop layer 102 may be a silicon-germanium (SiGe) layer and maybe, for example, epitaxially grown on top of the Si substrate 101. In another embodiment, the semiconductor substrate 100 may be a silicon-on-insulator (SOI) substrate to include a bulk Si substrate 101, an insulator layer 102 such as a silicon-nitride (SiN) or silicon-oxide ($SiO_2$) layer, and a Si layer 103 on top of the insulator layer 102. The insulator layer 102 may be used as or function as an etch-stop layer during a later process as being described below in more details.

Embodiments of present invention further provide forming a first raw blanket sacrificial layer 201 on top of the Si layer 103, a first raw stack of nanosheets 202 on top of the first raw blanket sacrificial layer 201, a second raw blanket sacrificial layer 301 on top of the first raw stack of nanosheets 202, and a second raw stack of nanosheets 302 on top of the second raw blanket sacrificial layer 301. The first and the second raw stack of nanosheets 202 and 302 may include a first and a second raw stack of blanket Si nanosheets 2021 and 3021, respectively, separated by a first and a second raw stack of blanket sacrificial sheets 2022 and 3022, respectively. The first and the second raw stack of blanket sacrificial sheets 2022 and 3022 may be, for example, SiGe sheets with a first germanium (Ge) concentration level. The first raw stack of nanosheets 202 may be used to form one or more bottom nanosheet transistors and the second raw stack of nanosheets 302 may be used to form one or more top nanosheet transistors on top of the one or more bottom nanosheet transistors, as being described below in more details.

On the other hand, the first and the second raw blanket sacrificial layer 201 and 301 may be, for example, SiGe layers as well with a second Ge concentration level, which may be different from the first Ge concentration level of the first and the second raw stack of blanket sacrificial sheets 2022 and 3022. For example, the first Ge concentration level may be around 30 ATM % of Ge and the corresponding blanket sacrificial sheets 2022 and 3022 may thus be referred to as SiGe30 sheets. In the meantime, the second Ge concentration level may be around 60 ATM % of Ge and the corresponding raw blanket sacrificial layers 201 and 301 may thus be referred to as SiGe60 layers. The difference in Ge concentration level between the raw blanket sacrificial layers 201 and 301 and the blanket sacrificial sheets 2022 and 3022 enables a selective etch process that may be utilized later to transform the first and the second raw blanket sacrificial layer 201 and 301 into a bottom dielectric insulation (BDI) layer and a middle dielectric insulation (MDI) layer as being described below in more details.

After forming the first and the second raw stack of nanosheets 202 and 302, a hard mask 309 may be formed on top of the second raw stack of nanosheets 302. The hard mask 309 may be patterned to have a pattern such as a longitudinal strip, and the pattern of the hard mask 309 may be transferred to the underneath first and second raw stacks of nanosheets 202 and 302, and the first and second raw blanket sacrificial layers 201 and 301, through a selective etching process as being described below in more details.

Figure 2:
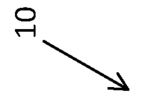
Figure 2:
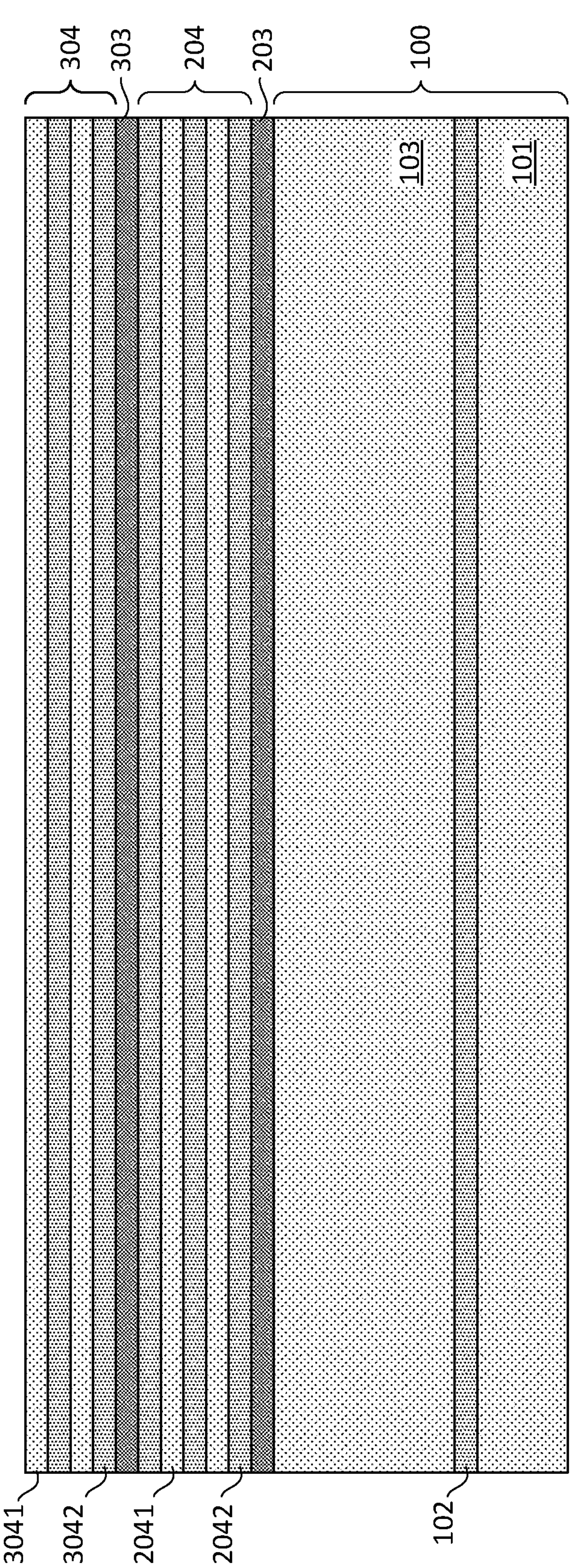

FIG. 2 is a demonstrative illustration of cross-sectional view of a semiconductor structure in a step of manufacturing thereof according to one embodiment of present invention. More particularly, following the step illustrated in FIG. 1, embodiments of present invention provide transferring the pattern of the hard mask 309 through, for example, a selective etch process, into the first and the second raw stack of nanosheets 202 and 302 and the first and the second raw blanket sacrificial layer 201 and 301, thereby forming a first and a second raw set of nanosheets 204 and 304 respectively and a first and a second raw sacrificial layer 203 and 303 respectively. The first raw set of nanosheets 204 formed thereby may include a raw set of Si nanosheets 2041 separated by a raw set of sacrificial sheets 2042. Similarly, the second raw set of nanosheets 304 formed thereby may include a raw set of Si nanosheets 3041 separated by a raw set of sacrificial sheets 3042.

Figure 3:
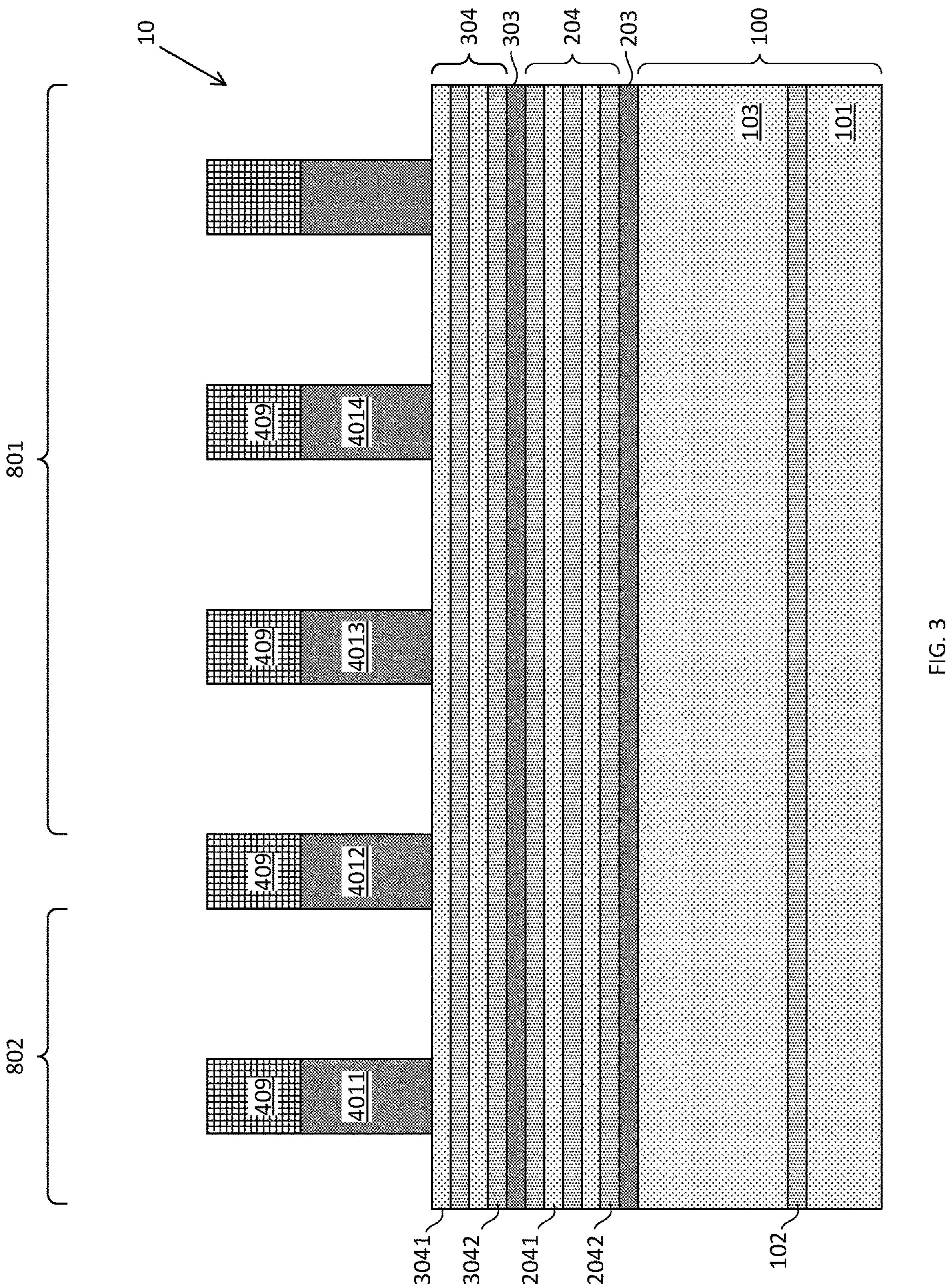

FIG. 3 is a demonstrative illustration of cross-sectional view of a semiconductor structure in a step of manufacturing thereof according to one embodiment of present invention. More particularly, following the step illustrated in FIG. 2, embodiments of present invention provide forming a set of sacrificial gates on top of the second raw set of nanosheets 304 in an active device region 801 and a passive device region 802. For example, the set of sacrificial gates may include, at least, a first sacrificial gate 4011 in the passive device region 802, a second sacrificial gate 4012 between the passive device region 802 and the active device region 801, and a third and a fourth sacrificial gate 4013 and 4014 in the active device region 801. Additional sacrificial gates may be formed as well and in one embodiment the set of sacrificial gates 4011, 4012, 4013, and 4014 may be formed in a pre-defined pitch to be equally spaced.

The set of sacrificial gates 4011, 4012, 4014, and 4014 may be formed by depositing a sacrificial gate material layer such as, for example, a layer of polysilicon on top of the second raw set of nanosheets 304 and creating a hard mask 409 of SiN, for example, on top of the sacrificial gate material layer. A selective etch process may then be applied to etch portions of the sacrificial gate material layer that are not covered, therefore exposed, by the hard mask 409, thereby transferring the pattern of the hard mask 409 onto the sacrificial gate material layer to form the set of sacrificial gates 4011, 4012, 4013, and 4014.

Figure 4:
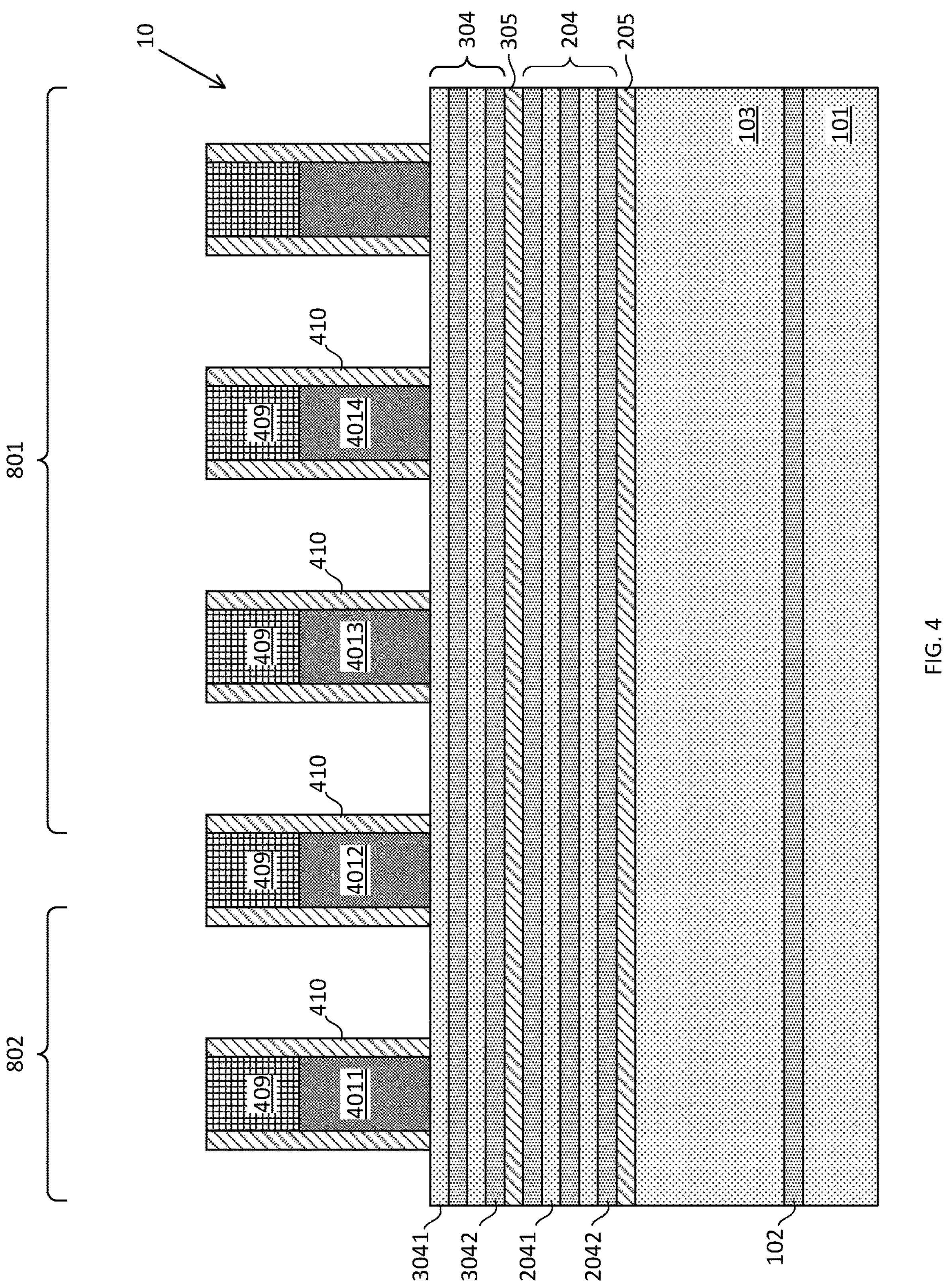

FIG. 4 is a demonstrative illustration of cross-sectional view of a semiconductor structure in a step of manufacturing thereof according to one embodiment of present invention. More particularly, following the step illustrated in FIG. 3, embodiments of present invention provide selectively removing the first and the second raw sacrificial layer 203 and 303 to create openings between the first raw set of nanosheets 204 and the Si layer 103 and between the second raw set of nanosheets 304 and the first raw set of nanosheets 204. For example, an etchant that provides different etch rate of SiGe with different Ge content may be used to remove the first and the second raw sacrificial layer 203 and 303, which may be SiGe60 with relatively high Ge content, selective to the sacrificial sheets 2042 and 3042, which may be SiGe30 with relatively low Ge content, and selective to the Si nanosheets 2041 and 3041, which may be Si nanosheets with even lower or no Ge content. Subsequently, the openings may be filled with a dielectric material in a deposition process to form a bottom dielectric isolation (BDI) layer 205 and a middle dielectric isolation (MDI) layer 305.

During the same deposition process or in a different deposition process, a conformal dielectric layer may be deposited on top of the semiconductor structure 10 covering both the top and sidewalls of the set of sacrificial gates 4011, 4012, 4013, and 4014, the hard mask 409, and the exposed top surface of the second raw set of nanosheets 304. A directional and/or selective etch process may subsequently be applied to remove horizontal portions of the conformal dielectric layer, leaving vertical portions of the conformal dielectric layer to form sidewall spacers 410 at sidewalls of the set of sacrificial gates 4011, 4012, 4013, and 4014. In one embodiment, the dielectric material may be SiN and thus the BDI layer 205, the MDI layer 305, and the sidewall spacers 410 may be made of SiN. However, embodiments of present invention are not limited in this aspect and other types of dielectric material such as, for example, $SiO_2$ may be used as well.

Figure 5:
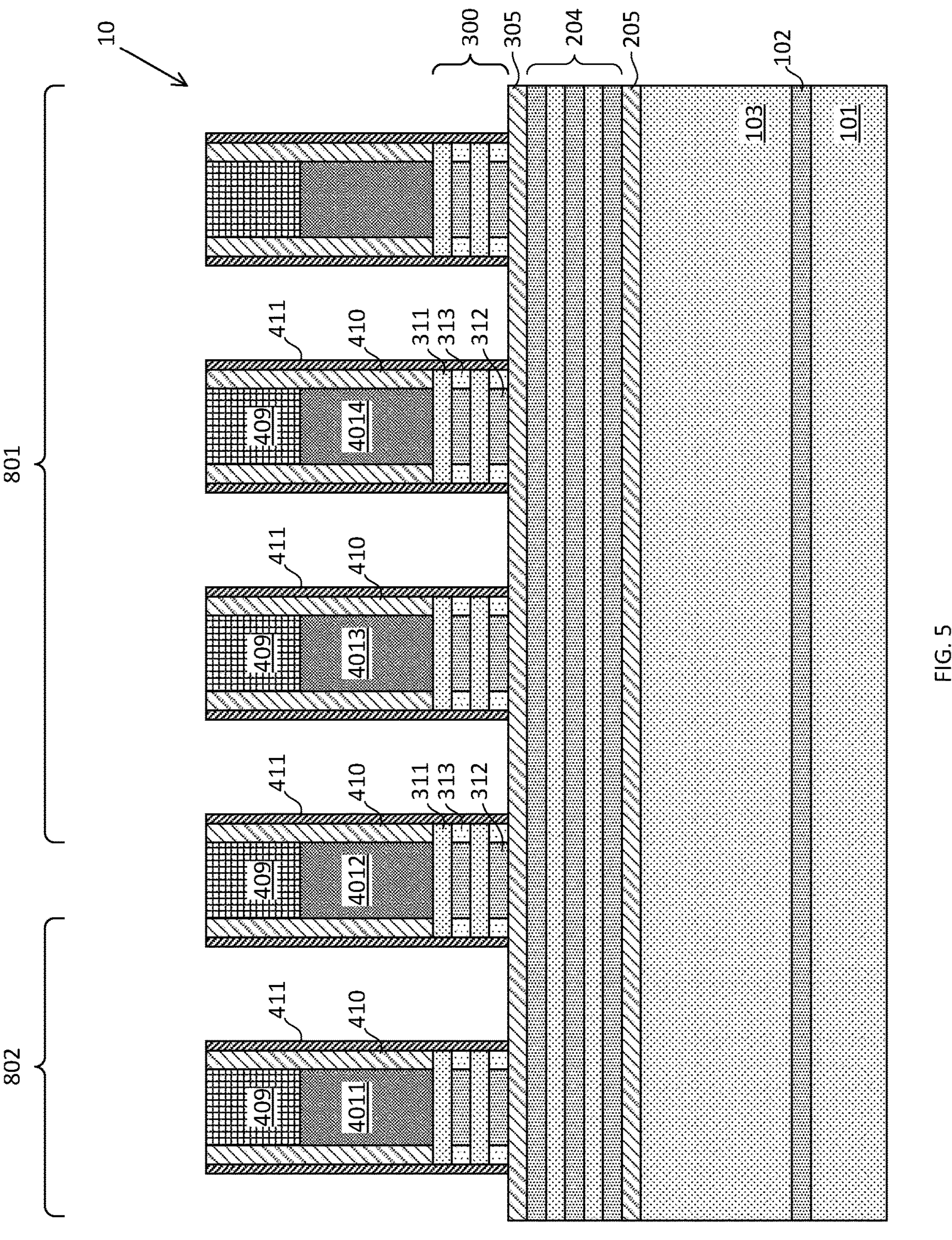

FIG. 5 is a demonstrative illustration of cross-sectional view of a semiconductor structure in a step of manufacturing thereof according to one embodiment of present invention. More particularly, following the step illustrated in FIG. 4, embodiments of present invention provide recessing the second raw set of nanosheets 304 to form the one or more top nanosheet transistors. For example, the second raw set of nanosheets 304 may be recessed or etched using the set of sacrificial gates 4011, 4012, 4013, and 4014 and sidewall spacers 410 as an etch mask until the MDI layer 305 is exposed. The recessing may create one or more sets of nanosheets 300 and recesses between the one or more sets of nanosheets 300. Each of the set of nanosheets 300 may include a set of Si nanosheets 311 separated by a set of sacrificial sheets 312. Next, inner spacers 313 may be formed at the ends of each set of the sacrificial sheets 312 through an indentation and dielectric deposition, and wet etch process.

After creating the one or more sets of nanosheets 300 and the inner spacers 313, embodiments of present invention provide forming one or more protective liners 411 lining sidewall surfaces of the one or more sets of nanosheets 300 such that the one or more sets of nanosheets 300 are protected during subsequent steps of forming the one or more bottom nanosheet transistors.

Figure 6:
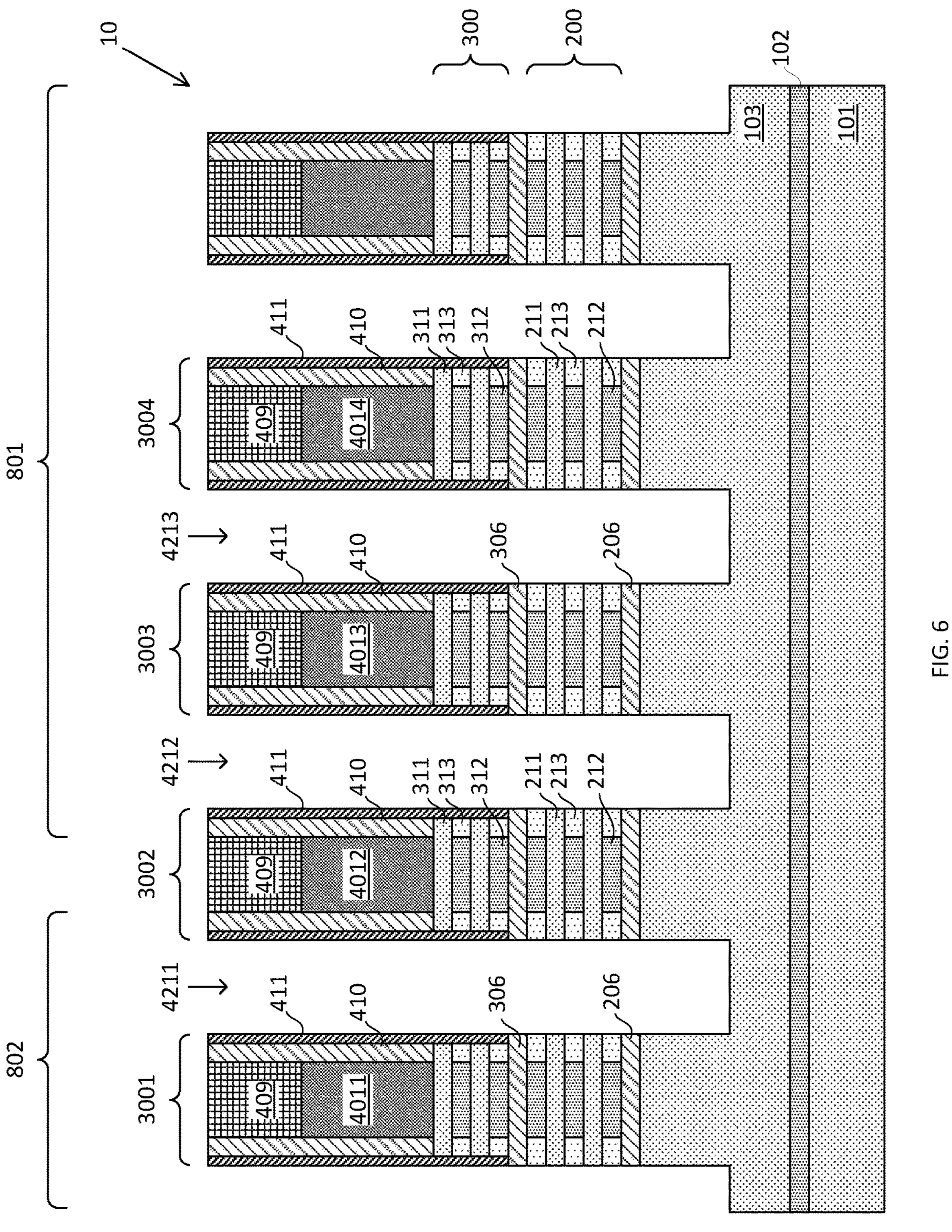

FIG. 6 is a demonstrative illustration of cross-sectional view of a semiconductor structure in a step of manufacturing thereof according to one embodiment of present invention. More particularly, following the step illustrated in FIG. 5, embodiments of present invention provide removing the exposed portions of the MDI layer 305 between the sacrificial gates 4011, 4012, 4013, and 4014 in a breakthrough etch process, leaving only portions of the MDI layer 305 to form a set of MDI 306 underneath the one or more sets of nanosheets 300, which isolates and/or insulates the one or more sets of nanosheets 300 from the (to be formed) one or more sets of nanosheets 200 underneath thereof. Embodiments of present invention further provide recessing or etching the first raw set of nanosheets 204 exposed by the removal of portions of the MDI layer 305, recessing or etching the subsequently exposed portions of the BDI layer 205, and recessing or etching at least partially into the Si layer 103 to create one or more recesses such as, for example, a first recess 4211, a second recess 4212, and a third recess 4213 between the set of sacrificial gates 4011, 4012, 4013, and 4014 and in the Si layer 103.

The recessing of the first raw set of nanosheets 204 may create one or more sets of nanosheets 200 with recesses between the one or more sets of nanosheets 200. Each of the set of nanosheets 200 may include a set of Si nanosheets 211 being separated by a set of sacrificial sheets 212. Indentation may subsequently be created and then filled with a dielectric material to form inner spacers 213. The removal of the exposed portions of the BDI layer 205 may create a set of self-aligned Si isolation (SASI) 206 underneath the one or more sets of nanosheets 200, which isolates and/or insulates the one or more sets of nanosheets 200 from the Si layer 103 of the semiconductor substrate 100.

According to one embodiment, the recessing of the second raw set of nanosheets 304 and the first raw set of nanosheets 204 may create one or more stacks of nanosheets such as a first stack of nanosheets 3001, a second stack of nanosheets 3002, a third stack of nanosheets 3003, and a fourth stack of nanosheets 3004. Each stack of nanosheets may include a first set of nanosheets 200 and a second set of nanosheets 300 with the second set of nanosheets 300 being on top of the first set of nanosheets 200 and separated from the first set of nanosheets 200 by the MDI 306.

Figure 7:
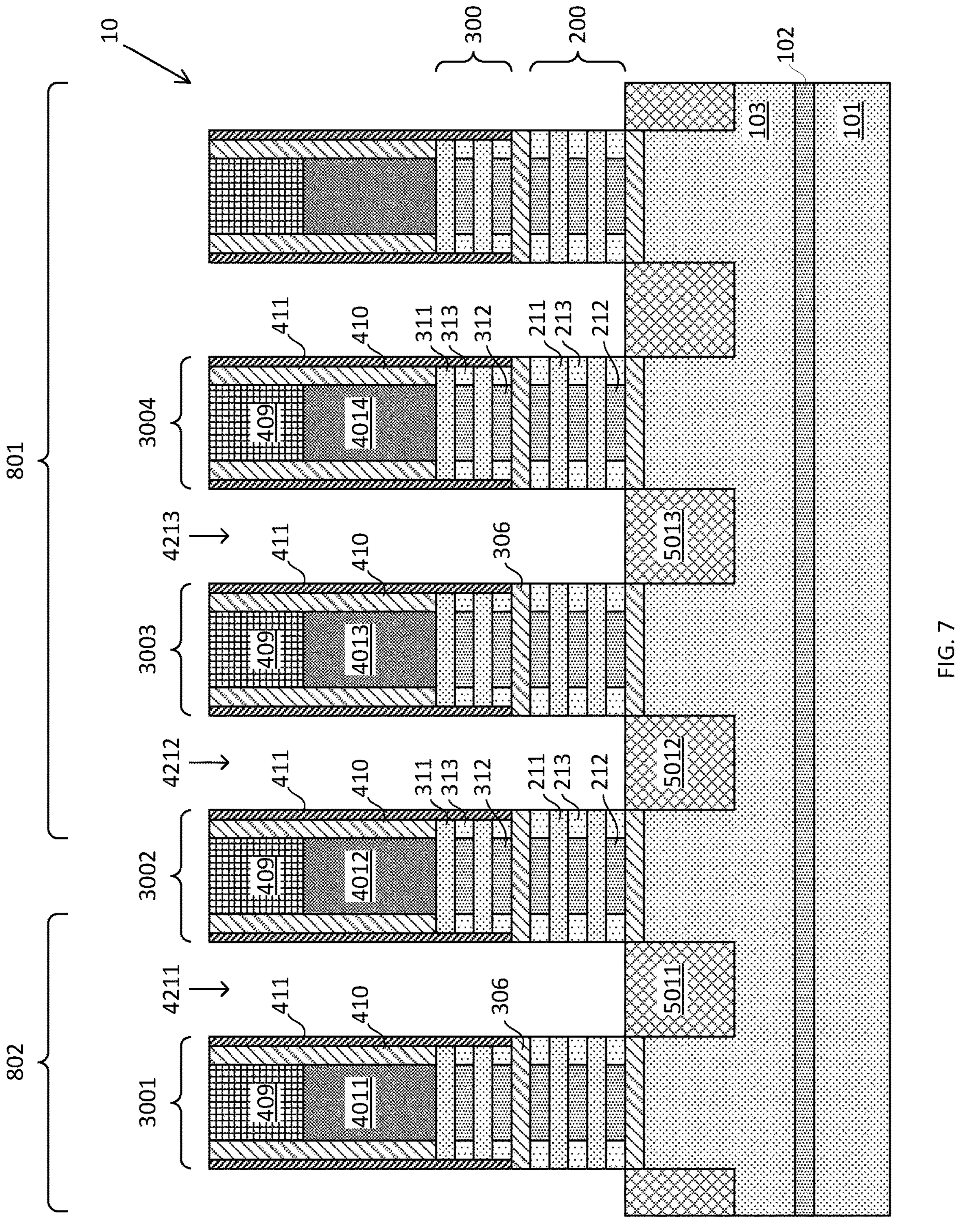

FIG. 7 is a demonstrative illustration of cross-sectional view of a semiconductor structure in a step of manufacturing thereof according to one embodiment of present invention. More particularly, following the step illustrated in FIG. 6, embodiments of present invention provide forming one or more placeholders in the one or more recesses in the Si layer 103. For example, a first, a second, and a third placeholder 5011, 5012, and 5013 may be formed in the first, the second, and the third recess 4211, 4212, and 4213 respectively. The first, the second, and the third placeholders 5011, 5012, and 5013 may be formed such that direct backside contacts may be formed later from the backside of the semiconductor substrate 100 to contact one or more active devices in the active device region 801 and/or one or more passive devices in the passive device region 802.

In one embodiment, the set of placeholders 5011, 5012, and 5013 may be made of or may include SiGe and the SiGe may be epitaxially grown from the Si layer 103 in the first, the second, and the third recess 4211, 4212 and 4213. The set of placeholders 5011, 5012, and 5013 may be grown to have a height, for example, above the top surface of the Si layer 103 but the growth may leave sidewalls of the one or more sets of nanosheets 200 exposed for further processing. In one embodiment, top surfaces of the placeholders 5011, 5012, and 5013 may be substantially co-planar.

Figure 8:
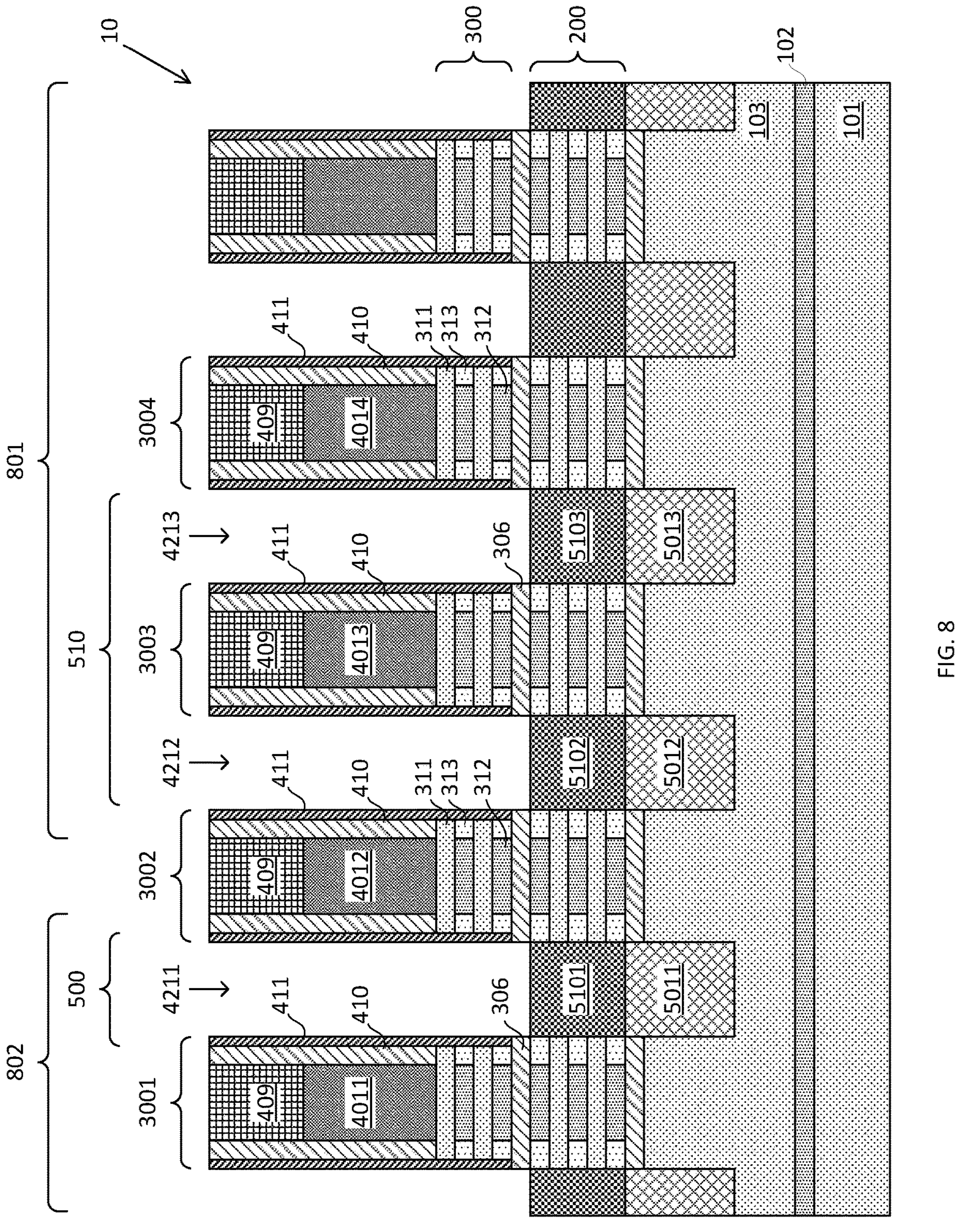

FIG. 8 is a demonstrative illustration of cross-sectional view of a semiconductor structure in a step of manufacturing thereof according to one embodiment of present invention. More particularly, following the step illustrated in FIG. 7, embodiments of present invention provide forming a first diffusion region 5101 of a first passive device 500 in the first recess 4211 in the passive device region 802. The first diffusion region 5101 may be formed between the first and the second stack of nanosheets 3001 and 3002 of the first set of nanosheets 200. The first diffusion region 5101 may be SiGe in material that may be epitaxially grown from the first placeholder 5011 and from sidewalls of the set of Si nanosheets 211 of the first set of nanosheets 200.

Embodiments of present invention may further provide forming a first source/drain (S/D) region 5102 and a second S/D region 5103 of a bottom nanosheet transistor, which may be referred to herein as a first nanosheet transistor 510. The first and second S/D regions 5102 and 5103 may be SiGe in material that may be epitaxially grown from the second and third placeholders 5012 and 5013 and from sidewalls of the second, third, and fourth stacks of nanosheets 3002, 3003, and 3004 of the first set of nanosheets 200. More particularly, the first and second S/D regions 5102 and 5103 may be epitaxially grown from sidewalls of the set of Si nanosheets 211 of the first set of nanosheets 200.

The epitaxial growth of the first diffusion region 5101 and the epitaxial growth of the first and second S/D regions 5102 and 5103 may be performed in a same epitaxial growth process, and the process may be controlled such that the first diffusion region 5101 and the first and second S/D regions 5102 and 5103 may cover only sidewalls of the first set of nanosheets 200. For example, in one embodiment, a recess process may be applied to lower heights of the first diffusion region 5101 and the first and second S/D regions 5102 and 5103 such that they stay at or below the MDI 306. In one embodiment, because a single and same epitaxial growth process is used, the first diffusion region 5101 and the first and second S/D regions 5102 and 5103 may be made to have a substantially same height. In other words, top surfaces of the first diffusion region 5101 and the first and second S/D regions 5102 and 5103 may be made substantially co-planar. The epitaxial growth process may be combined with an either negative or positive dopant implantation process such that the formed first diffusion region 5101 and the first and second S/D regions 5102 and 5103 may be positively doped or negatively doped, depending on specific applications.

Figure 9:
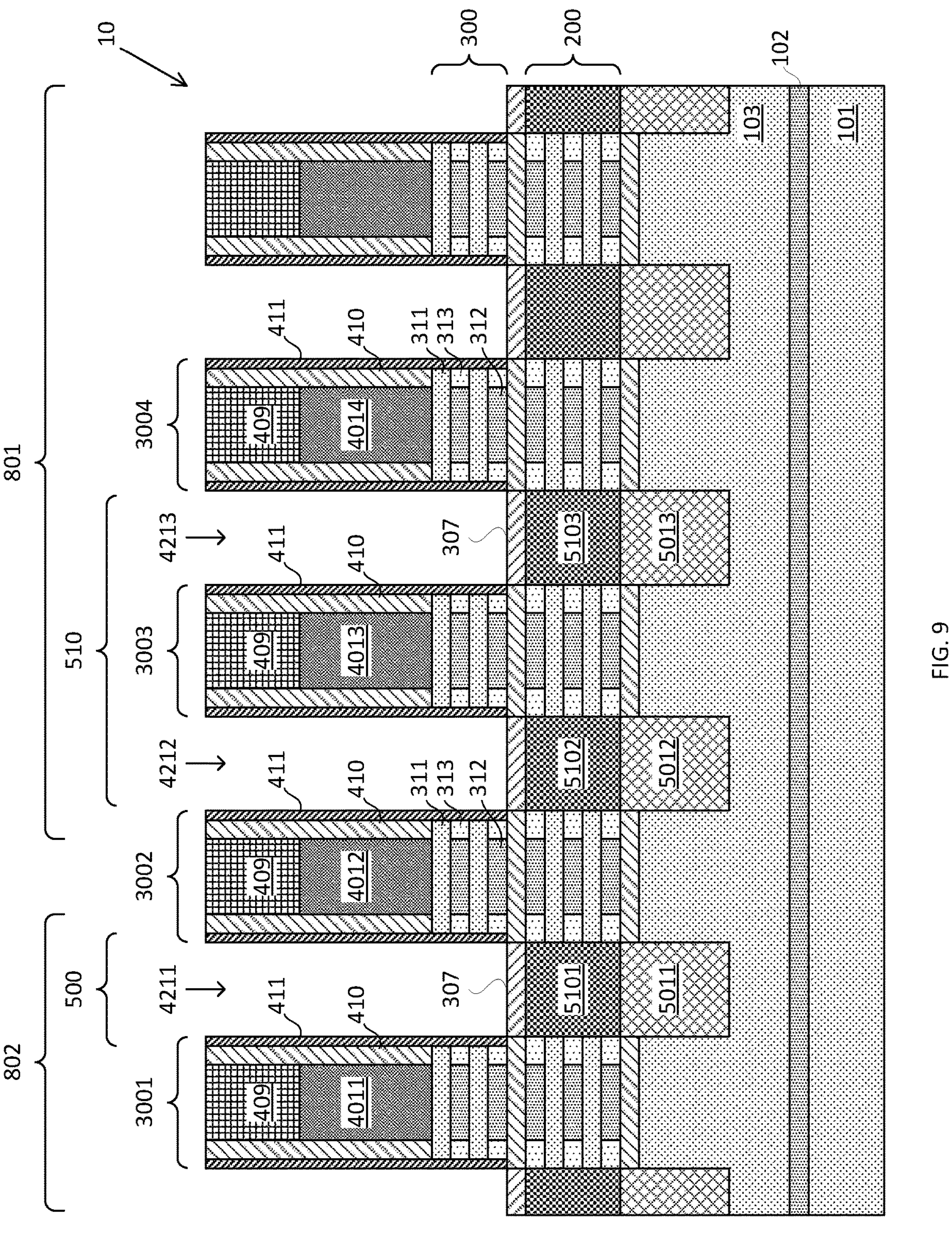

FIG. 9 is a demonstrative illustration of cross-sectional view of a semiconductor structure in a step of manufacturing thereof according to one embodiment of present invention. More particularly, following the step illustrated in FIG. 8, embodiments of present invention provide forming an inter-level dielectric (ILD) layer 307 on top of the first diffusion region 5101 and the first and second S/D regions 5102 and 5103. The ILD layer 307 may be formed by depositing a layer of dielectric material into the first, second, and third recesses 4211, 4212, and 4213 between the sacrificial gates 4011, 4012, 4013, and 4014. Next, a chemical-mechanical-polishing (CMP) process may be applied to planarize a top surface of the deposited dielectric material that fills the recesses 4211, 4212, and 4213. Subsequently, the dielectric material may be recessed until the protective liners 411 are exposed. The protective liners 411 cover sidewalls of the set of nanosheets 300, which may be used to form a top nanosheet transistor later as is described below in more details.

Figure 10:
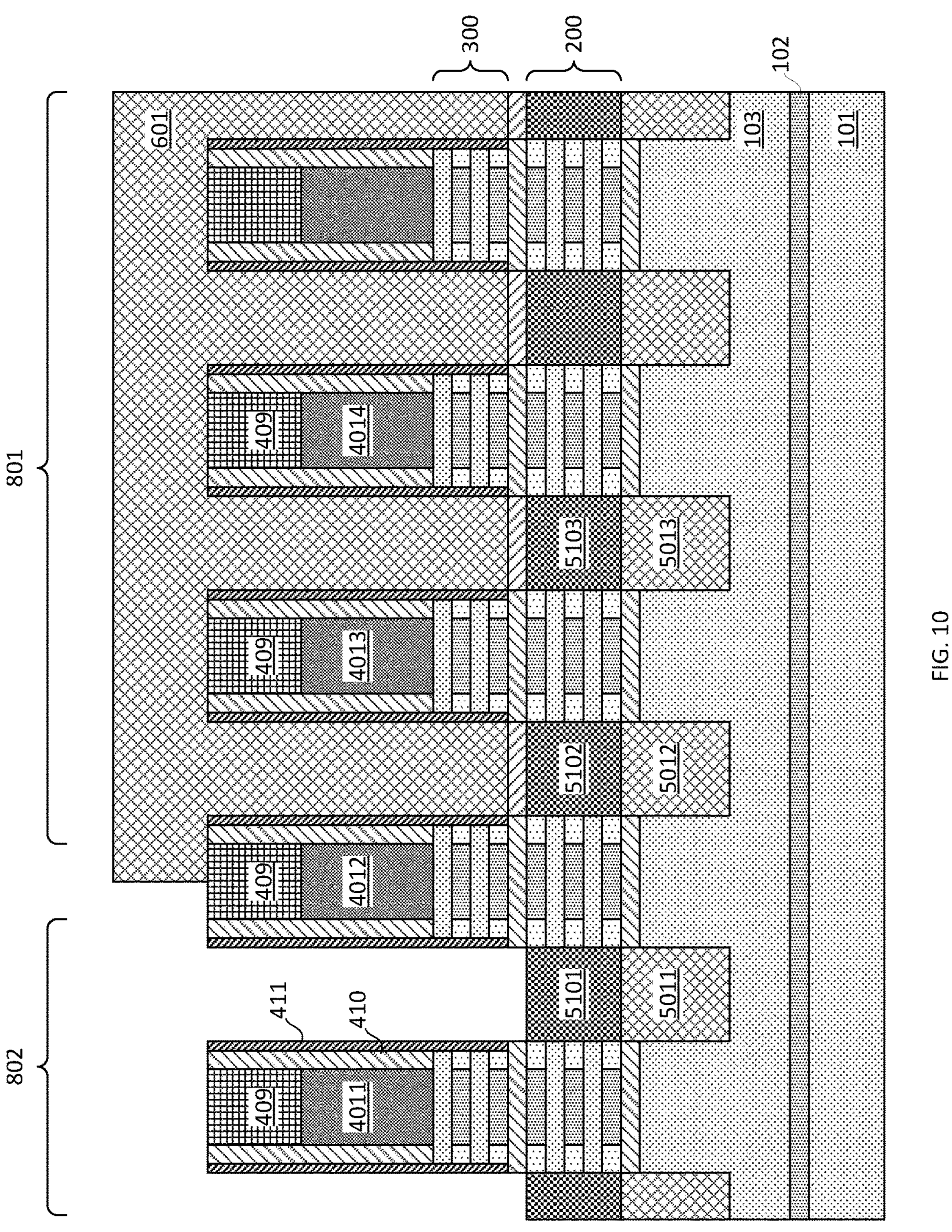

FIG. 10 is a demonstrative illustration of cross-sectional view of a semiconductor structure in a step of manufacturing thereof according to one embodiment of present invention. More particularly, following the step illustrated in FIG. 9, embodiments of present invention provide covering the active device region 801 with an organic planarization layer (OPL) 601 while leaving the passive device region 802 exposed. The OPL 601 may be applied such that it fills recesses between the sacrificial gates, such as between the second, third, and fourth sacrificial gates 4012, 4013, and 4014, thereby protecting the ILD layer 307 on top of the first and second S/D regions 5102 and 5103 of the first nanosheet transistor 510. With the active device region 801 being covered, the passive device region 802 may be processed to continue forming the first passive device 500. For example, the ILD layer 307 between the first and the second sacrificial gate 4011 and 4012 may be selectively removed to expose the underneath first diffusion region 5101 for further processing.

Figure 11:
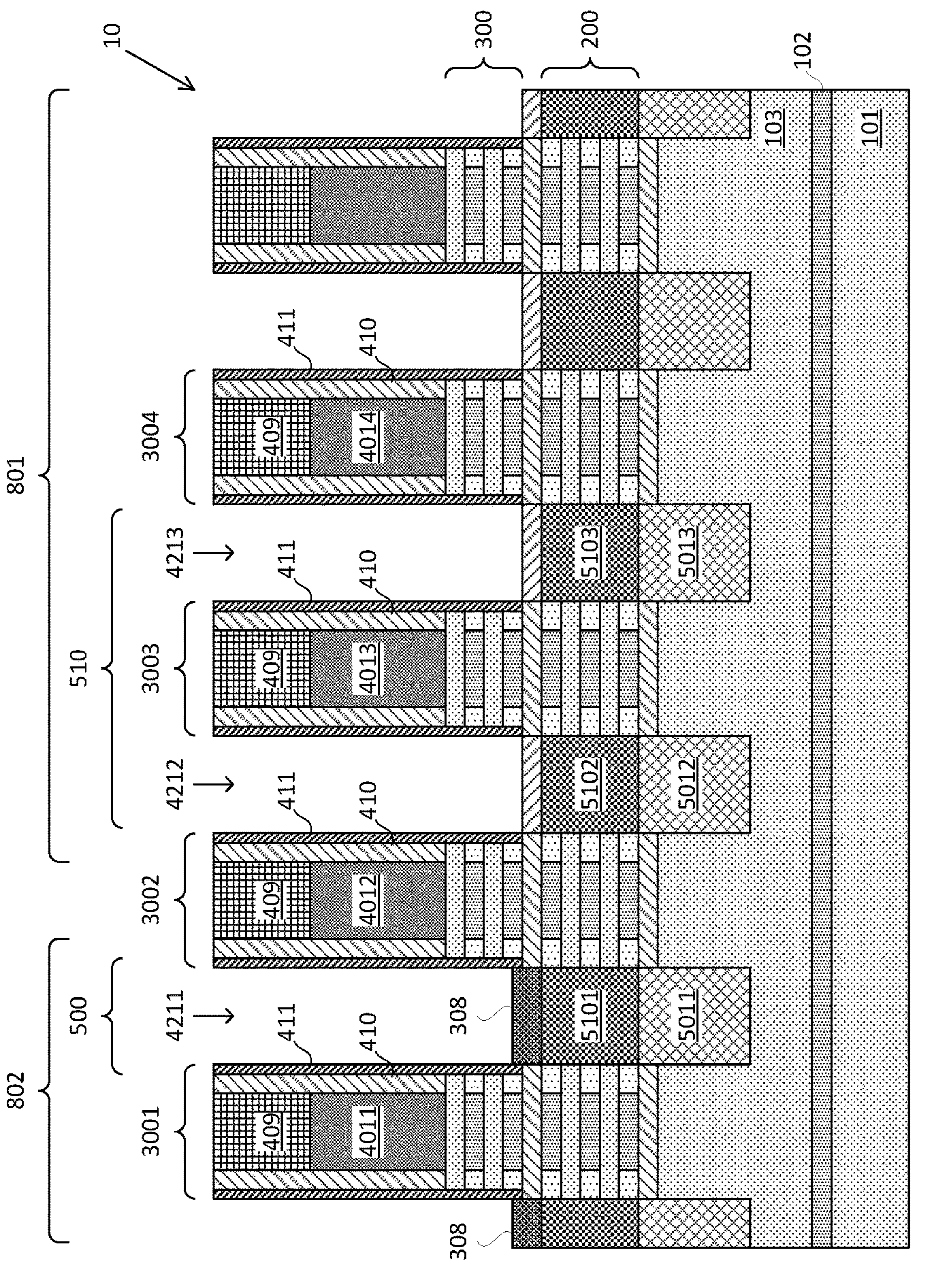

FIG. 11 is a demonstrative illustration of cross-sectional view of a semiconductor structure in a step of manufacturing thereof according to one embodiment of present invention. More particularly, following the step illustrated in FIG. 10, embodiments of present invention provide epitaxially growing a layer of doped region 308, for example lightly doped, on top of the first diffusion region 5101. The doped region 308 may be a Si layer or a SiGe layer and may be lightly doped with either positive or negative dopants such as, for example, boron (B) or phosphorus (P). The doped region 308 may be formed to have a thickness that is comparable with that of the MDI 306, thereby leaving at least most of the protective liners 411 still substantially exposed. After forming the doped region 308, the OPL 601 in the active device region 801 may be removed through, for example, an ash process.

Figure 12:
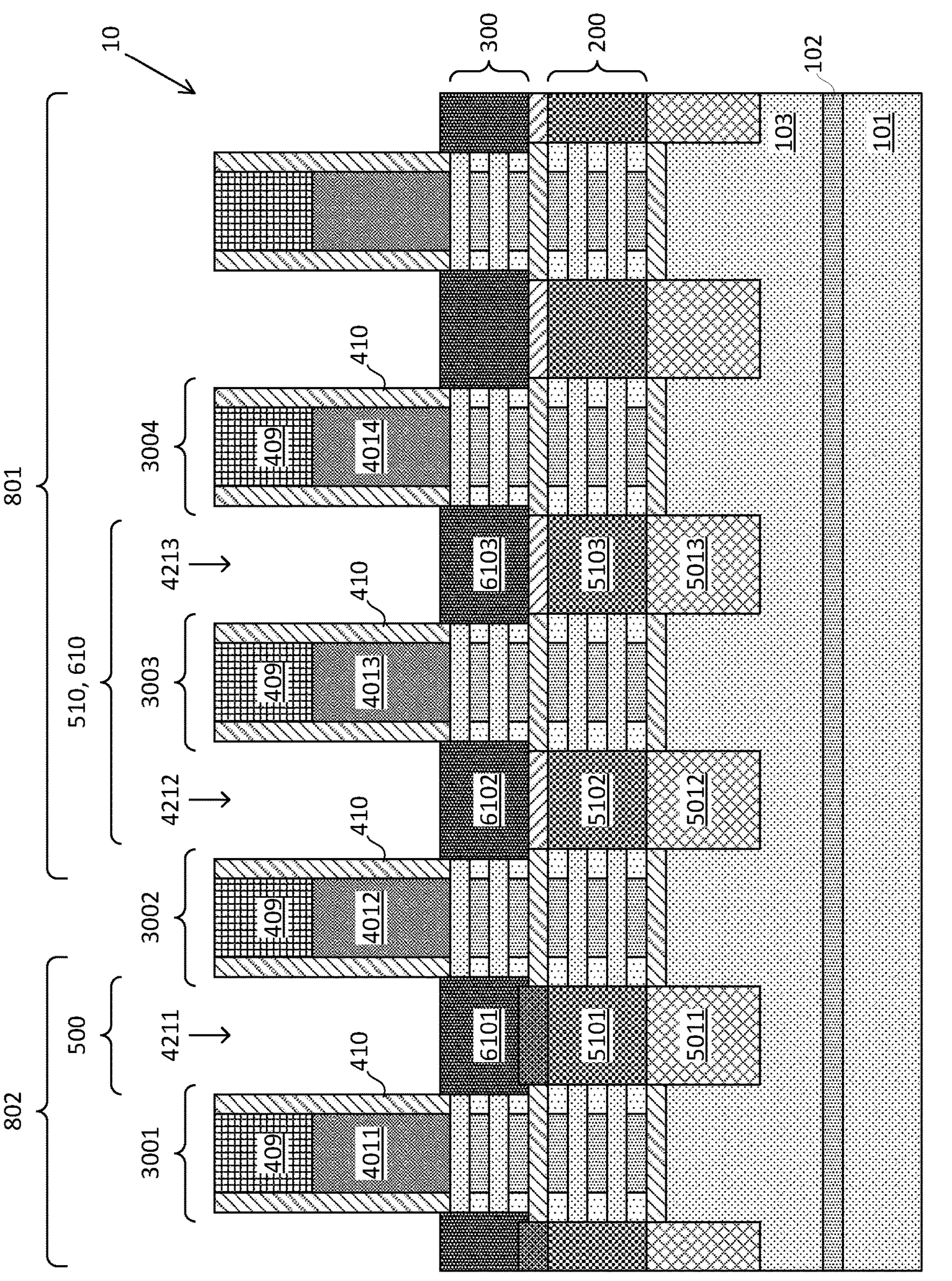

FIG. 12 is a demonstrative illustration of cross-sectional view of a semiconductor structure in a step of manufacturing thereof according to one embodiment of present invention. More particularly, following the step illustrated in FIG. 11, embodiments of present invention provide removing the protective liners 411 that cover sidewalls of the set of nanosheets 300 of the top nanosheet transistor, which is referred to herein as a second nanosheet transistor 610. A second diffusion region 6101 of the first passive device 500 may be formed on top of the doped region 308 and a third and a fourth S/D region 6102 and 6103 may be formed on top of the ILD layer 307 above the first S/D region 5102 and the second S/D region 5103 respectively.

In the active device region 801, the third and fourth S/D regions 6102 and 6103 may be epitaxially grown from sidewalls of the second, third, and fourth stacks of nanosheets 3002, 3003, and 3004 of the set of nanosheets 300. In the passive device region 802, the second diffusion region 6101 may be grown from both sidewalls of the first and second stacks of nanosheets 3001 and 3002 of the set of nanosheets 300, and from the top surface of the doped region 308. The top surface of the second diffusion region 6101 may be made substantially co-planar with top surfaces of the third and fourth S/D regions 6102 and 6103 of the second nanosheet transistor 610. For example, the second diffusion region 6101 and the third and fourth S/D regions 6102 and 6103 may be formed through a single or a same epitaxial growth process and may subsequently be recessed to have substantially co-planar top surfaces. In one embodiment, the second diffusion region 6101 and the third and fourth S/D regions 6102 and 6103 may be doped with either p-type or n-type dopant and may be doped with dopant opposite to that of the first diffusion region 5101.

Figure 13:
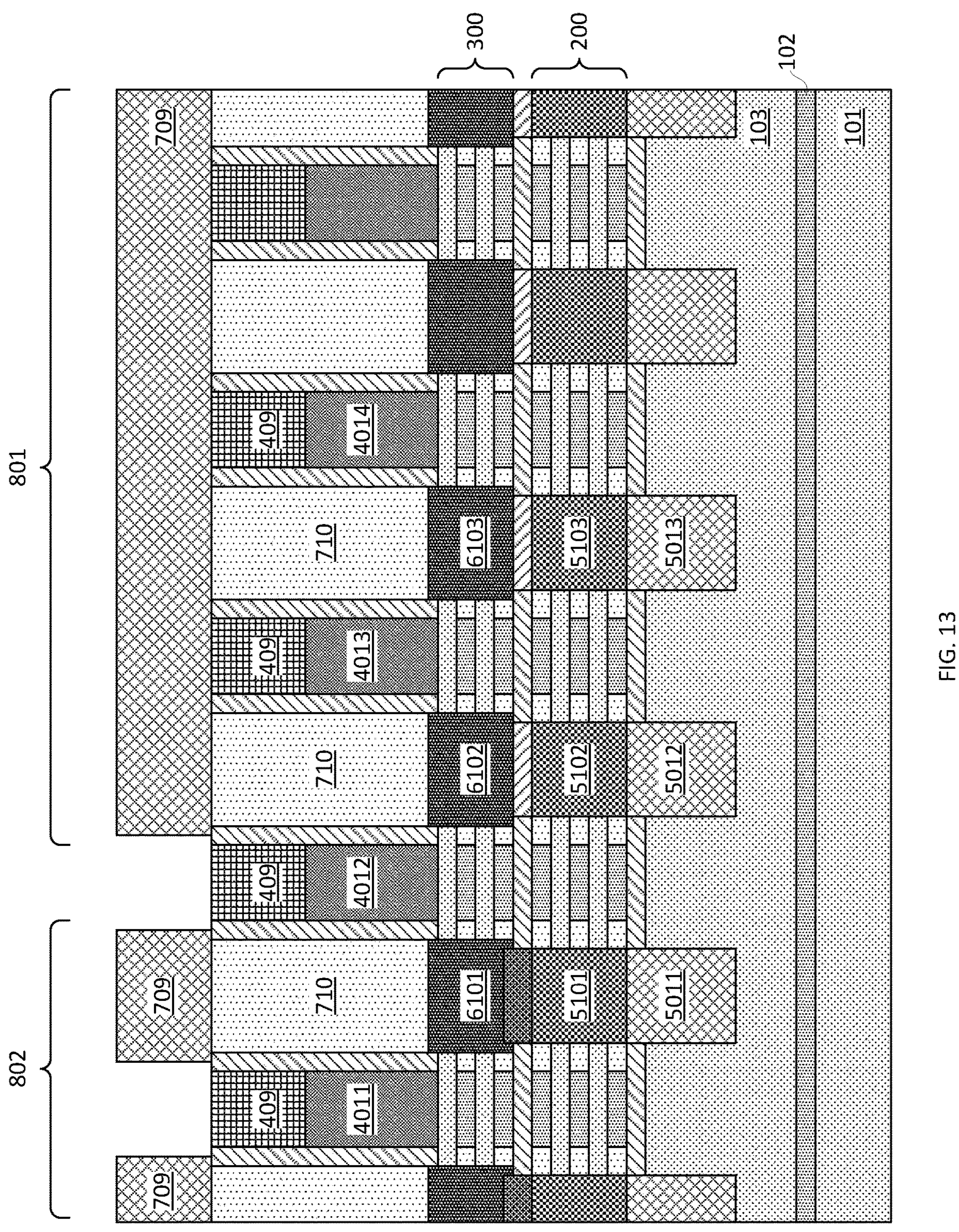

FIG. 13 is a demonstrative illustration of cross-sectional view of a semiconductor structure in a step of manufacturing thereof according to one embodiment of present invention. More particularly, following the step illustrated in FIG. 12, embodiments of present invention provide filling the remaining portions of recesses between the sacrificial gates 4011, 4012, 4013, and 4014 with a dielectric material and subsequently applying a CMP process to planarize a top surface of the dielectric material to form an ILD layer 710.

After forming the ILD layer 710, embodiments of present invention provide proceeding to form a single diffusion break to isolate and/or insulate the active device region 801 from the passive device region 802, and in the passive device region 802 to form one or more single diffusion breaks to isolate and/or insulate individual passive devices. For example, a mask 709 of OPL may be formed on top of the ILD layer 710. The mask 709 may include one or more openings that expose the first sacrificial gate 4011, which separate the first passive device 500 from rest areas of the passive device region 802, and the second sacrificial gate 4012, which separates the active device region 801 from the passive device region 802.

Figure 14:
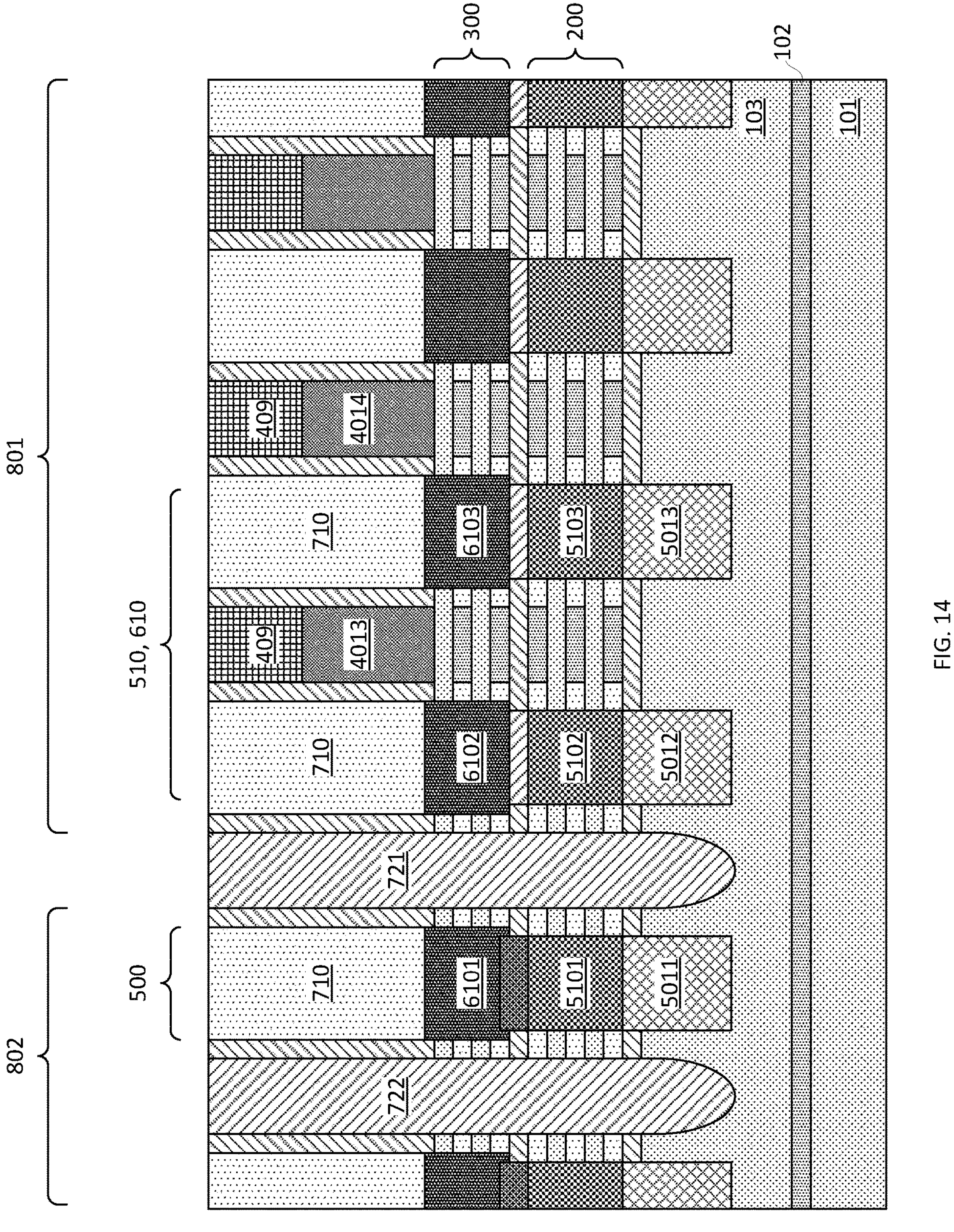

FIG. 14 is a demonstrative illustration of cross-sectional view of a semiconductor structure in a step of manufacturing thereof according to one embodiment of present invention. More particularly, following the step illustrated in FIG. 13, embodiments of present invention provide performing a selective etch process to remove the hard mask 409 exposed by the openings of the mask 709 and remove the sacrificial gates 4011 and 4012 underneath thereof. Embodiments of present invention further provide continuing to remove the exposed set of nanosheets 300; the MDI 306; the set of nanosheets 200; and a portion of the Si layer 103 that are subsequently exposed, thereby creating one or more openings. The created one or more openings may extend partially into the Si layer 103.

After creating the one or more openings, the mask 709 may be removed through an ash process. A dielectric material may be used to fill the one or more openings, which is then followed by a CMP process to form one or more single diffusion breaks (SDB's) such as, for example, a first SDB 721 and a second SDB 722. More particularly, for example, the first SDB 721 may isolate and/or separate the active device region 801 from the passive device region 802. Further for example, the second SDB 722 may separate nearby passive devices in the rest areas of the passive device region 802 from the first passive device 500. As is demonstratively illustrated in FIG. 14, the first SDB 721 may have a first side (right side) near or adjacent to the active device region 801 and more particularly near or adjacent to the first S/D region 5102 of the first nanosheet transistor 510 and near or adjacent to the third S/D region 6102 of the second nanosheet transistor 610. The first SDB 721 may have a second side (left side) near or adjacent to the passive device region 802 and more particularly near or adjacent to the first passive device 500.

Figure 15:
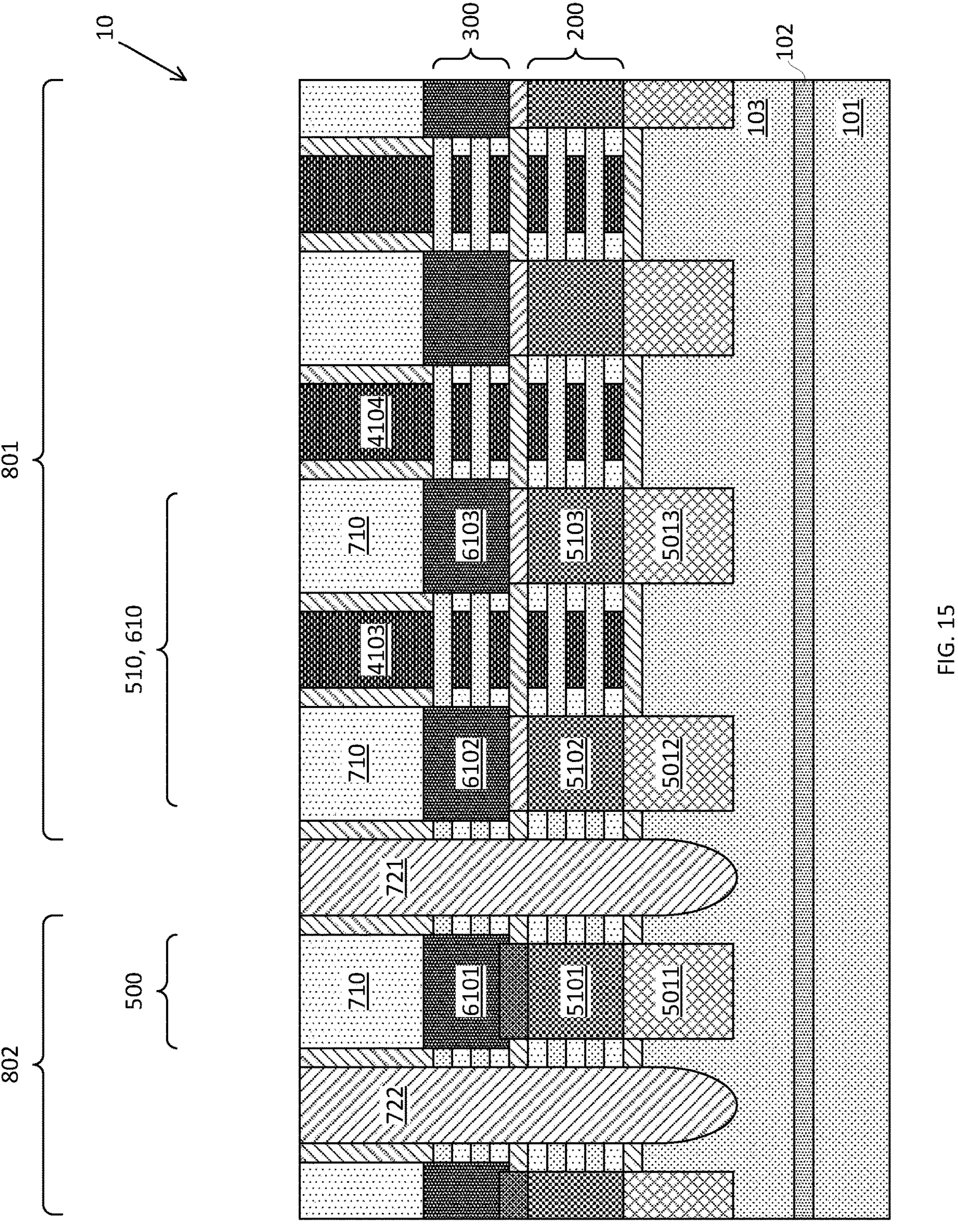

FIG. 15 is a demonstrative illustration of cross-sectional view of a semiconductor structure in a step of manufacturing thereof according to one embodiment of present invention. More particularly, following the step illustrated in FIG. 14, embodiments of present invention provide continuing forming, in the active device region 801, the first nanosheet transistor 510 and the second nanosheet transistor 610 on top of the first nanosheet transistor 510. More specifically, embodiments of present invention provide removing the hard mask 409 on top of the sacrificial gates 4013 and 4014 through, for example, a CMP process and subsequently performing a replacement-metal-gate (RMG) process to remove, selective to the Si nanosheets 311 and 211 and the MDI 306, the sacrificial gates 4013 and 4014, the sacrificial sheets 312 that separate the Si nanosheets 311, and the sacrificial sheets 212 that separate the Si nanosheets 211. Next, embodiments of present invention provide forming a gate dielectric layer, one or more work-function metal layers, and a layer of conductive material such as, for example, Cu, Co, W, and/or Ru to surround the exposed Si nanosheets 311 and 211, thereby forming gate metal 4103 and 4104. A CMP process may be subsequently applied to planarize a top surface of the gate metal 4103 and 4104.

Figure 16:
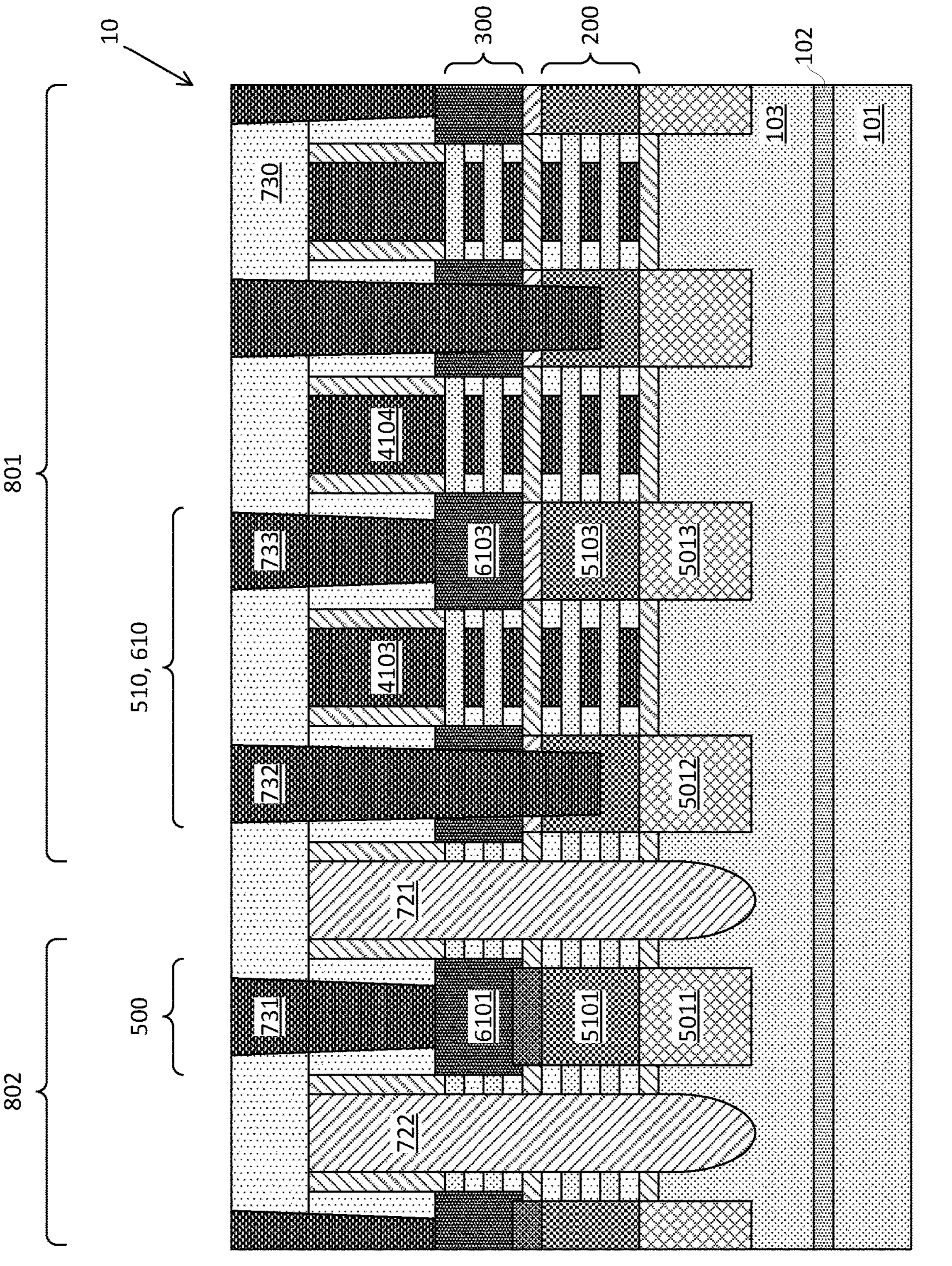

FIG. 16 is a demonstrative illustration of cross-sectional view of a semiconductor structure in a step of manufacturing thereof according to one embodiment of present invention. More particularly, following the step illustrated in FIG. 15, embodiments of present invention provide forming an ILD layer 730 covering the gate metal 4103 and 4104 and the ILD layer 710. One or more middle-of-line (MOL) contacts, such as a first MOL contact 731, a second MOL contact 732, and a third MOL contact 733 may be formed through the ILD layer 730 to be in contact with the first passive device 500, the first and the second nanosheet transistors 510 and 610. For example, the first MOL contact 731 may be formed to contact the second diffusion region of the first passive device 500, the second MOL contact 732 may contact both the first S/D region 5102 of the first nanosheet transistor 510 and the third S/D region 6102 of the second nanosheet transistor 610. In other words, the second MOL contact 732 may be formed as a shared MOL contact by the first and second nanosheet transistors 510 and 610. Further for example, the third MOL contact 733 may be formed to contact the fourth S/D region of the second nanosheet transistor 610.

Figure 17:
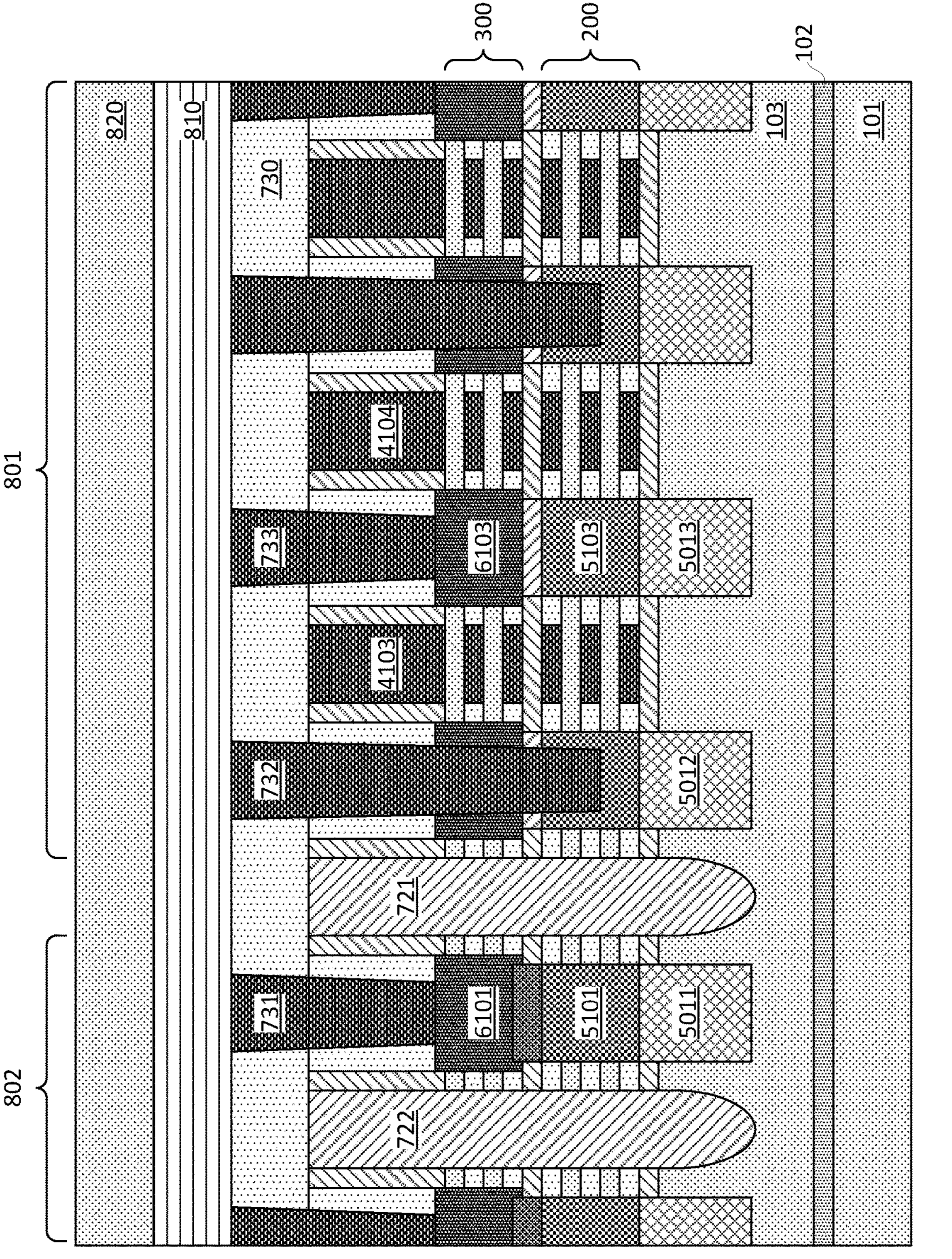

FIG. 17 is a demonstrative illustration of cross-sectional view of a semiconductor structure in a step of manufacturing thereof according to one embodiment of present invention. More particularly, following the step illustrated in FIG. 16, embodiments of present invention provide forming a back-end-of-line (BEOL) structure 810 on top of the ILD layer 730. The BEOL structure 810 may be in contact with one or more MOL contacts such as the first, the second, and the third MOL contact 731, 732, and 733 to provide signal routing and/or power supply to the underneath first passive device 500 and the active device of stacked first nanosheet transistor 510 and second nanosheet transistor 610. Following the formation of the BEOL structure 810, a carrier wafer 820 may be attached to the top of the BEOL structure 810. The carrier wafer 820 may be used such that the semiconductor structure 10 may be flipped up-side down for further processing from a backside of the semiconductor substrate 100.

It is to be noted here that upside-up (instead of upside-down) drawings will continue to be used hereinafter, for FIG. 18-FIG. 22, for ease of illustration. However, description of the drawings may be provided in a manner that is consistent with processing from the backside of the semiconductor substrate 100.

Figure 18:
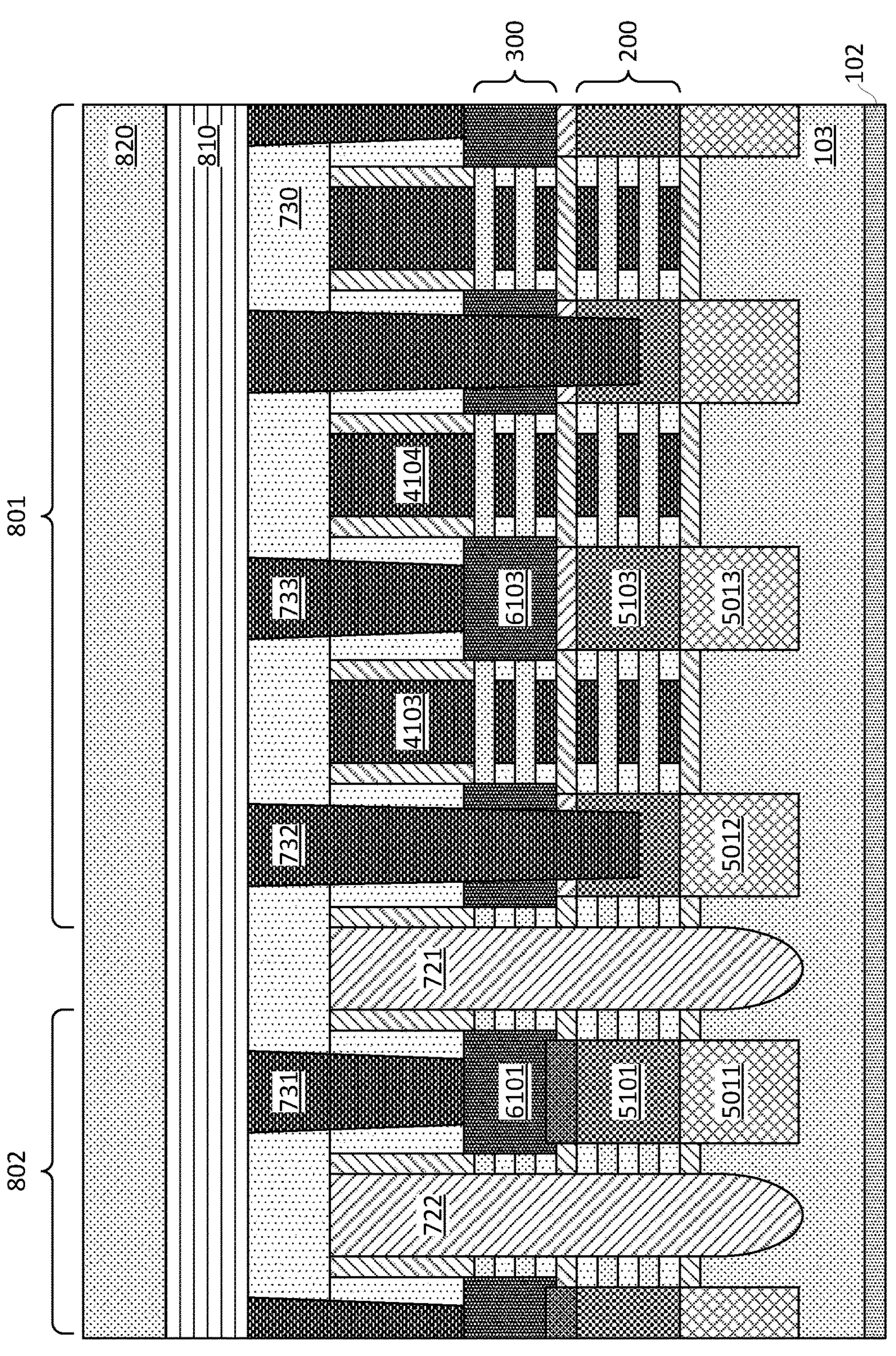

FIG. 18 is a demonstrative illustration of cross-sectional view of a semiconductor structure in a step of manufacturing thereof according to one embodiment of present invention. More particularly, following the step illustrated in FIG. 17, embodiments of present invention provide removing the Si substrate 101 through, for example, a CMP process, a grinding process, and/or in combination with other selective etching processes. The removal of the Si substrate 101 may stop at the etch-stop layer 102.

Figure 19:
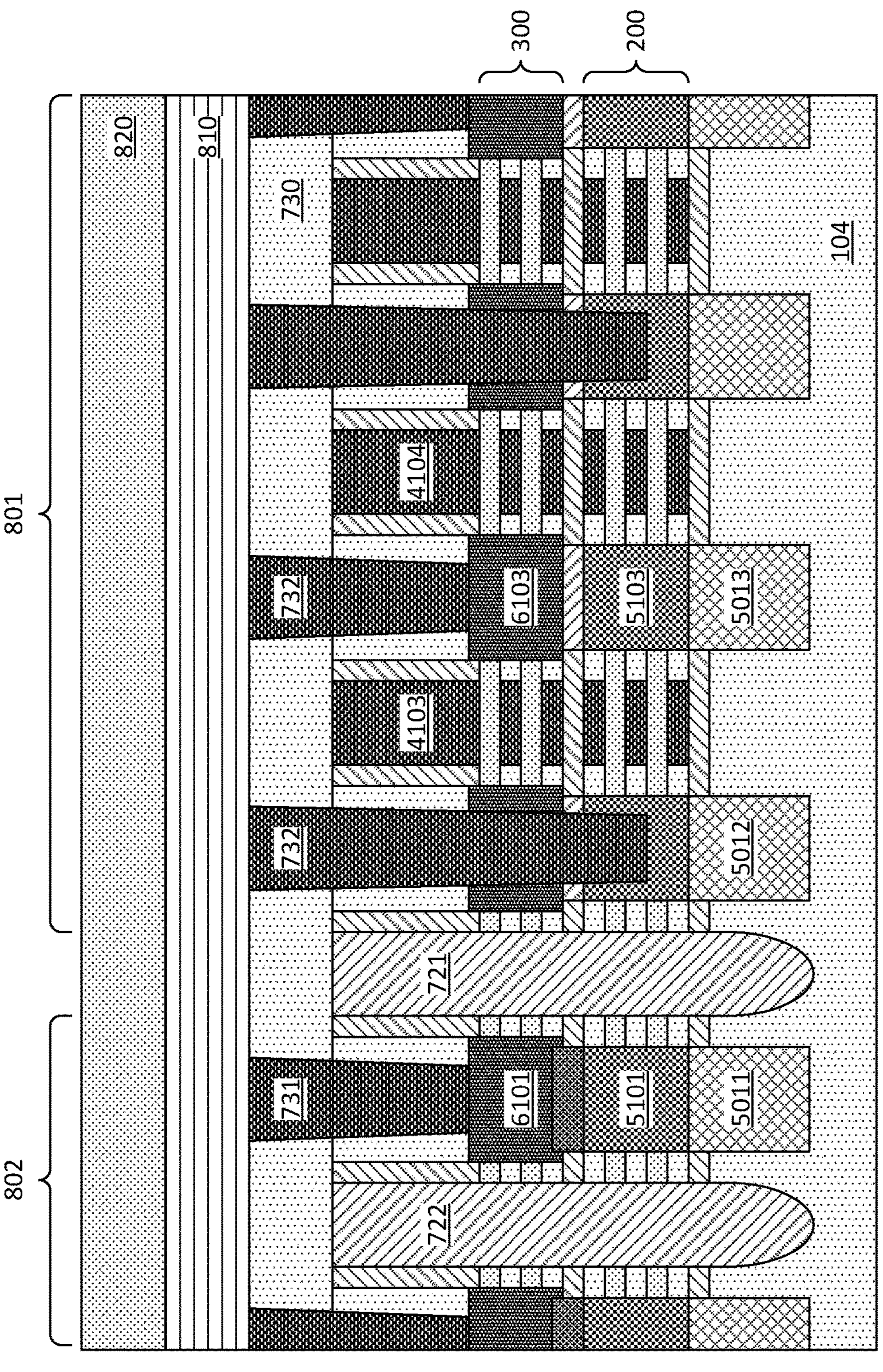

FIG. 19 is a demonstrative illustration of cross-sectional view of a semiconductor structure in a step of manufacturing thereof according to one embodiment of present invention. More particularly, following the step illustrated in FIG. 18, embodiments of present invention provide continuing to remove the etch-stop layer 102 by changing the etchant that is suitable for the etch-stop layer. The selective removal of the etch-stop layer 102 may expose the underneath Si layer 103. Next, embodiments of present invention provide recessing and/or removing the exposed Si layer 103 until, in one embodiment, the SASI 206, the placeholders such as the first, the second, and the third placeholder 5011, 5012, and 5013, and the first SDB 721 and the second SDB 722 are exposed. Next, a backside ILD (BILD) layer 104 may be deposited in replacement of the Si layer 103. The BILD layer 104 may cover the first, the second, and the third placeholder 5011, 5012, and 5013, the SASI 206, and the first and the second SDB 721 and 722.

Figure 20:
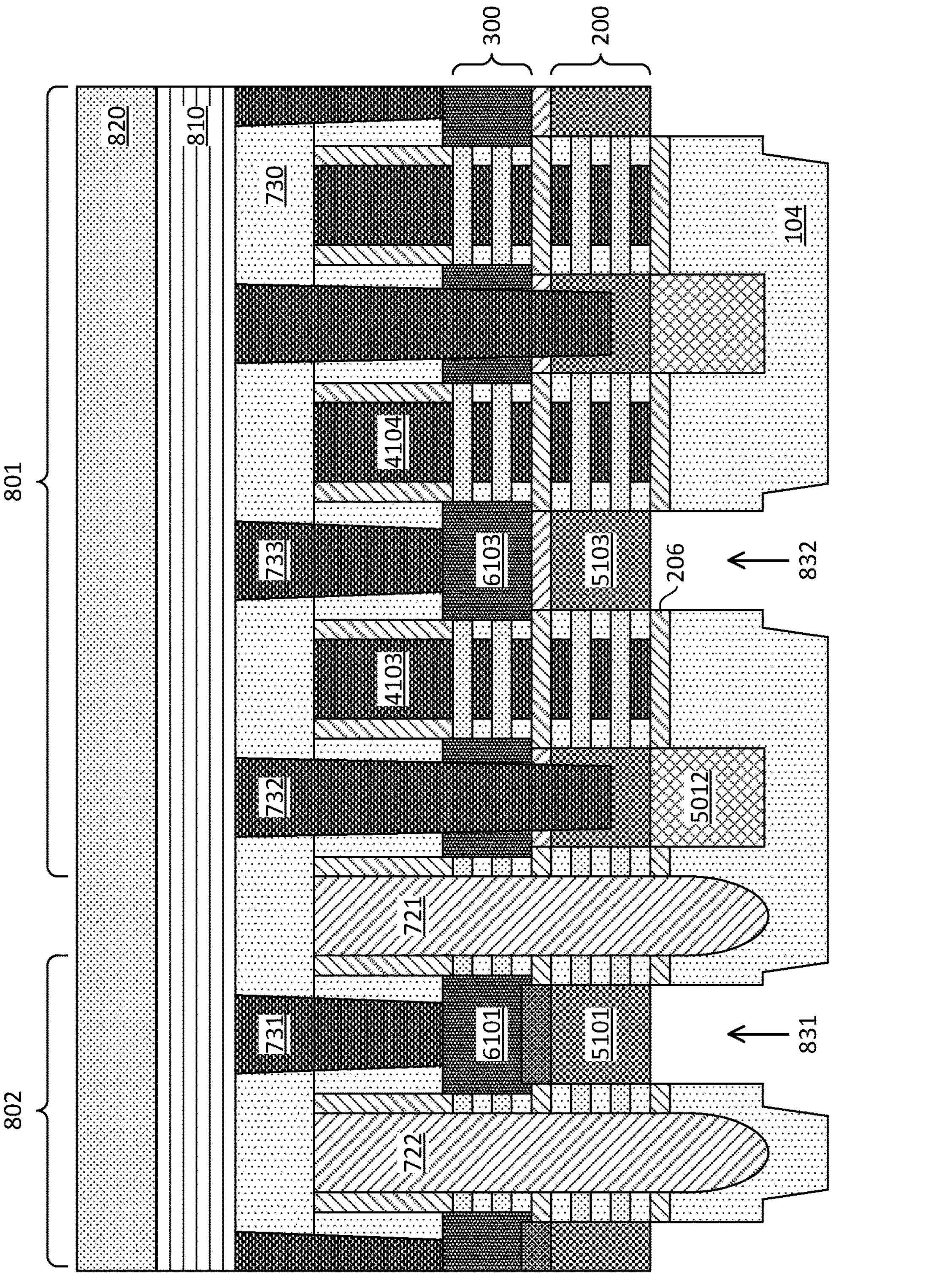

FIG. 20 is a demonstrative illustration of cross-sectional view of a semiconductor structure in a step of manufacturing thereof according to one embodiment of present invention. More particularly, following the step illustrated in FIG. 19, embodiments of present invention provide creating openings in the BILD layer 104 to expose one or more of the placeholders such as the first placeholder 5011 and the third placeholder 5013. The exposed first and third placeholders 5011 and 5013 are then removed through a selective etching process thereby creating at least a first opening 831 and a second opening 832. The first opening 831 may expose a bottom surface of the first diffusion region 5101 and the second opening 832 may expose a bottom surface of the second S/D region 5103 of the first nanosheet transistor 510.

Figure 21:
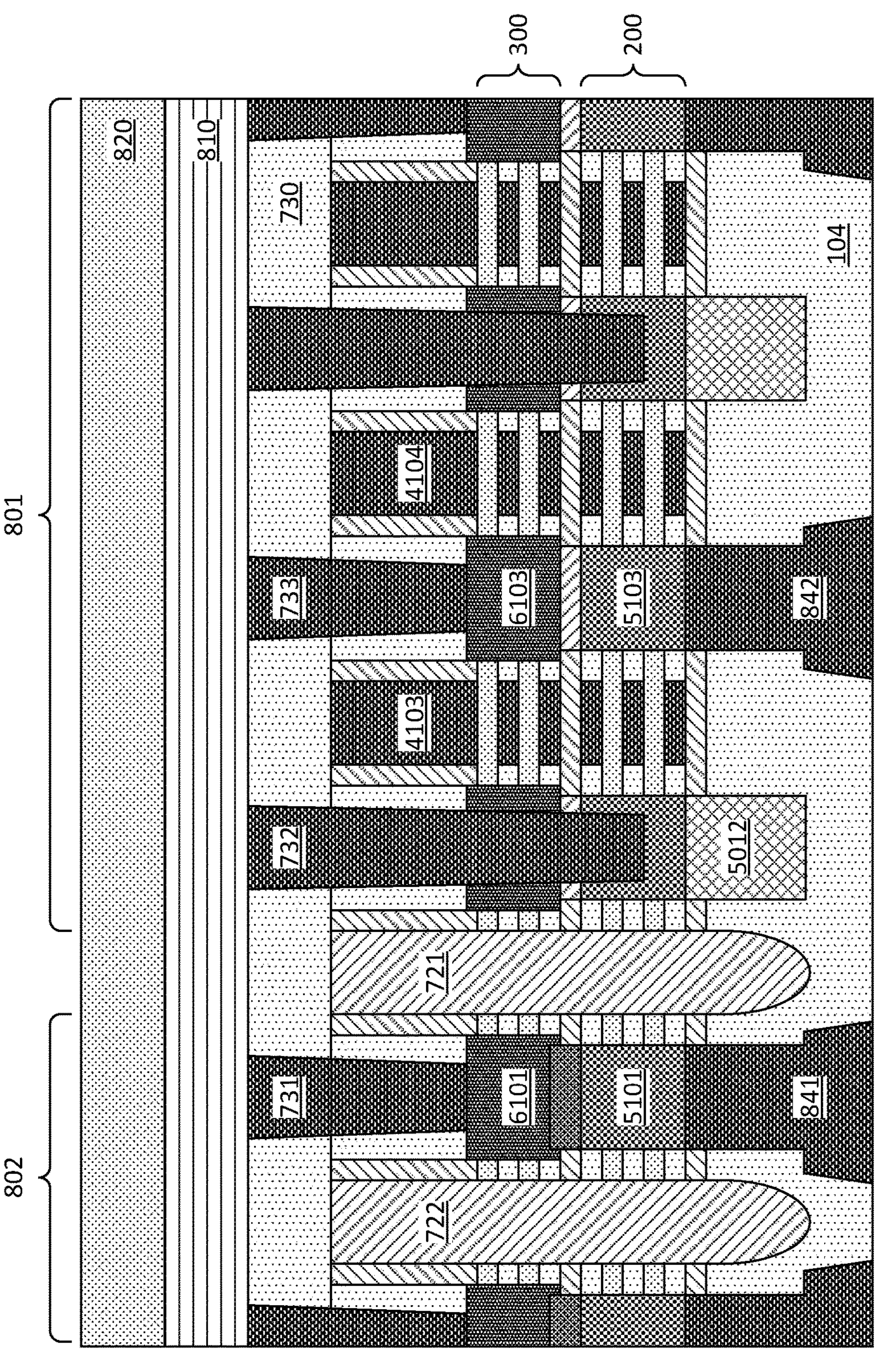

FIG. 21 is a demonstrative illustration of cross-sectional view of a semiconductor structure in a step of manufacturing thereof according to one embodiment of present invention. More particularly, following the step illustrated in FIG. 20, embodiments of present invention provide depositing a conductive material such as W, Co, Al, and/or Ru in the first and the second opening 831 and 832 to form a first direct backside contact (BSCA) 841 and a second direct BSCA 842. The first direct BSCA 841 is in direct contact with the first diffusion region 5101 of the first passive device 500 and the second direct BSCA 842 is in direct contact with the second S/D region 5103 of the first nanosheet transistor 510. Here, the first diffusion region 5101, the lightly doped region 308 on top of the first diffusion region 5101, and the second diffusion region 6101 on top of the lightly doped region 308 form the first passive device 500 such as a diode. The lightly doped region 308 vertically connects the first diffusion region 5101 with the second diffusion region 6101.

Figure 22:
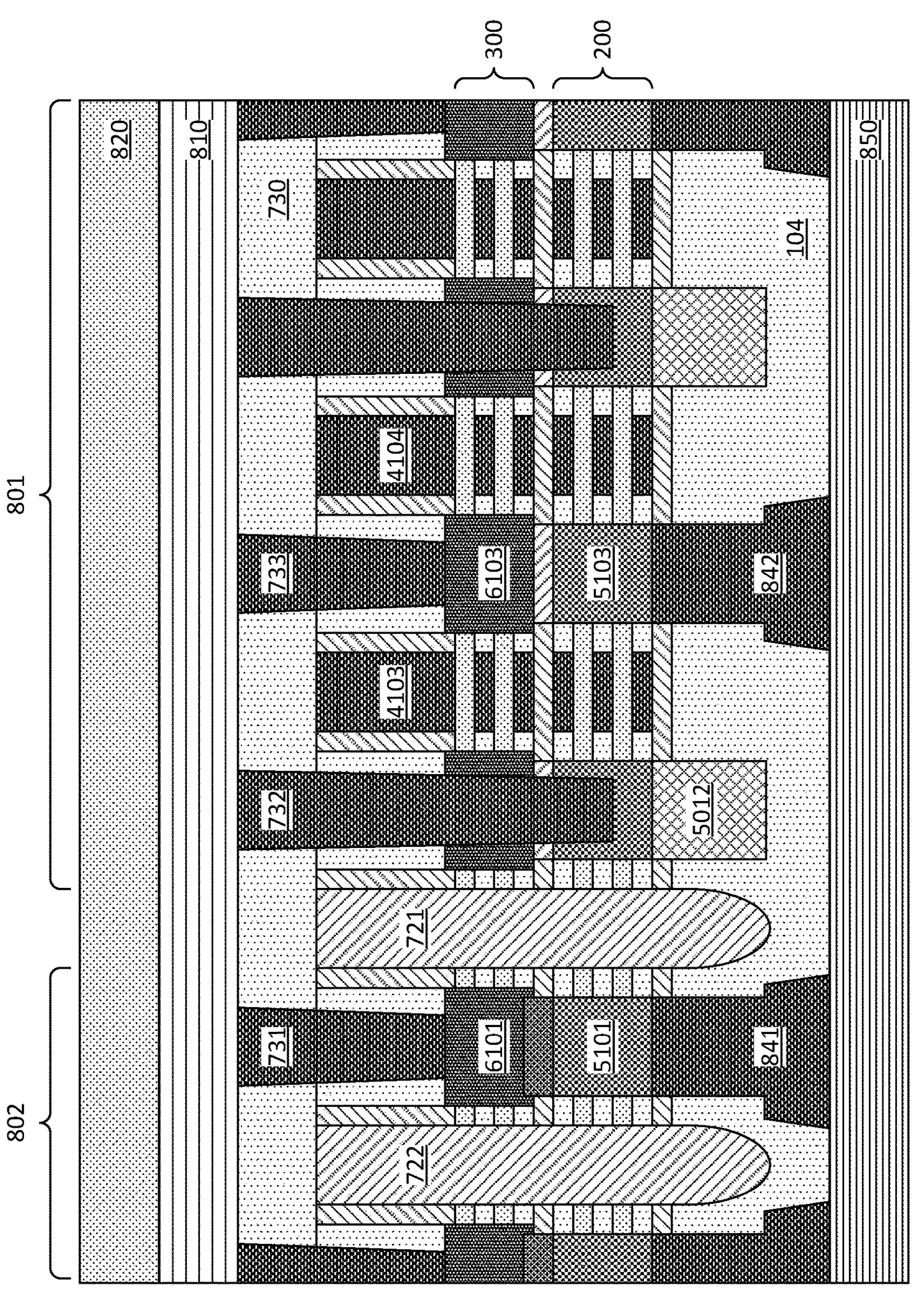

FIG. 22 is a demonstrative illustration of cross-sectional view of a semiconductor structure in a step of manufacturing thereof according to one embodiment of present invention. More particularly, following the step illustrated in FIG. 21, embodiments of present invention provide forming a backside power distribution network (BSPDN) structure 850 on top of the BILD layer 104 and in contact with at least the first direct BSCA 841 and the second direct BSCA 842. In other words, the first diffusion region 5101 of the first passive device 500 is connected to the BSPDN structure 850 through the first direct BSCA 841 and the second diffusion region 6101 of the first passive device 500 is connected to the BEOL structure 810 through a first MOL contact 731.

As is demonstratively illustrated in FIG. 22, the first SDB 721 has a first side (right side) near the first S/D region 5102 of the first nanosheet transistor 510 and near the third S/D region 6102 of the second nanosheet transistor 610. The first SDB 721 has a second side (left side) near the first passive device 500. On the other hand, the first passive device 500 has a first side (right side) near the first SDB 721 and a second side (left side) near the second SDB 722.

FIG. 23 is a demonstrative illustration of a flow-chart of a method of manufacturing a semiconductor structure according to embodiments of present invention. The method includes (910) forming a first, a second, a third, and a fourth stack of nanosheets on a substrate that each includes a first set of nanosheets and a second set of nanosheets on top of the first set of nanosheets and are separated by a first, a second, and a third recess respectively, where the first stack of nanosheets and the first recess are in a passive device region, and the second and third recesses and the third and fourth stacks of nanosheets are in an active device region, and where the passive device region and the active device region are separated by the second stack of nanosheets; (920) forming a first, a second, and a third placeholder, embedded in the substrate, in the first recess between the first and the second stack of nanosheets, in the second recess between the second and the third stack of nanosheets, and in the third recess between the third and the fourth stack of nanosheets; (930) forming, in a single or same epitaxial growth process, a first diffusion region of a first passive device in the first recess; a first source/drain (S/D) region of a first nanosheet transistor in the second recess; and a second S/D region of the first nanosheet transistor in the third recess, where the first diffusion and the first and second S/D regions are adjacent to the first set of nanosheets; (940) forming a lightly doped region on top of the first diffusion region and an interlevel dielectric (ILD) layer on top of the first and the second S/D region of the first nanosheet transistor; (950) forming, in a single or same epitaxial growth process, a second diffusion region of the first passive device on top of the lightly doped region; a third S/D region of a second nanosheet transistor on top of the first S/D region of the first nanosheet transistor; and a fourth S/D region of the second nanosheet transistor on top of the second S/D region of the first nanosheet transistor; (960) selectively removing the second stack of nanosheets to create an opening and subsequently filling the opening with a dielectric material to form a first single diffusion break that separates the passive device region from the active device region; and (970) removing the first and the third placeholder to create a first and a second opening and filling the first and the second opening with a conductive material to form a first and a second direct backside contact (BSCA) contacting a bottom surface of the first diffusion region of the first passive device and a bottom surface of the second S/D region of the first nanosheet transistor.

It is to be understood that the exemplary methods discussed herein may be readily incorporated with other semiconductor processing flows, semiconductor devices, and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Accordingly, at least portions of one or more of the semiconductor structures described herein may be implemented in integrated circuits. The resulting integrated circuit chips may be distributed by the fabricator in raw wafer form (that is, as a single wafer that has multiple unpackaged chips), as a bare die, or in a packaged form. In the latter case the chip may be mounted in a single chip package (such as a plastic carrier, with leads that are affixed to a motherboard or other high-level carrier) or in a multichip package (such as a ceramic carrier that has surface interconnections and/or buried interconnections). In any case the chip may then be integrated with other chips, discrete circuit elements, and/or other signal processing devices as part of either an intermediate product, such as a motherboard, or an end product. The end product may be any product that includes integrated circuit chips, ranging from toys and other low-end applications to advanced computer products having a display, a keyboard or other input device, and a central processor.

The descriptions of various embodiments of present invention have been presented for the purposes of illustration and they are not intended to be exhaustive and present invention are not limited to the embodiments disclosed. The terminology used herein was chosen to best explain the principles of the embodiments, practical application or technical improvement over technologies found in the marketplace, and to enable others of ordinary skill in the art to understand the embodiments disclosed herein. Many modifications, substitutions, changes, and equivalents will now occur to those of ordinary skill in the art. Such changes, modification, and/or alternative embodiments may be made without departing from the spirit of present invention and are hereby all contemplated and considered within the scope of present invention. It is, therefore, to be understood that the appended claims are intended to cover all such modifications and changes as fall within the spirit of the invention.

What is claimed is:

1. A semiconductor structure comprising:

an active device region and a passive device region, the active device region and the passive device region being separated by a single diffusion break, wherein the passive device region includes a first passive device and the first passive device includes:

a first diffusion region and a second diffusion region, the first and the second diffusion region being vertically connected by a doped region, wherein the first diffusion region is connected to a backside power distribution network (BSPDN) through a first direct backside contact (BSCA) and the second diffusion region is connected to a back-end-of-line (BEOL) structure through a first middle-of-line (MOL) contact.

2. The semiconductor structure of claim 1, wherein the active device region includes a first nanosheet transistor with a first and a second source/drain (S/D) region and includes a second nanosheet transistor with a third and a fourth S/D region, the third and the fourth S/D region of the second nanosheet transistor being separated from the first and the second S/D region, respectively, of the first nanosheet transistor by a first interlevel dielectric (ILD) layer.

3. The semiconductor structure of claim 2, wherein a top surface of the first diffusion region of the first passive device is substantially co-planar with a top surface of the first S/D region of the first nanosheet transistor and the first diffusion region is made of a substantially same material as the first S/D region of the first nanosheet transistor.

4. The semiconductor structure of claim 2, wherein a top surface of the second diffusion region of the first passive device is substantially co-planar with a top surface of the third S/D region of the second nanosheet transistor and the second diffusion region is made of a substantially same material as the third S/D region of the second nanosheet transistor.

5. The semiconductor structure of claim 2, wherein the first S/D region of the first nanosheet transistor and the third S/D region of the second nanosheet transistor are connected to the BEOL structure by a second MOL contact, and the fourth S/D region of the second nanosheet transistor is connected to the BEOL structure by a third MOL contact.

6. The semiconductor structure of claim 2, wherein the active device region includes a placeholder underneath the first S/D region of the first nanosheet transistor, and the second S/D region of the first nanosheet transistor is connected to the BSPDN through a second direct BSCA.

7. The semiconductor structure of claim 2, wherein the single diffusion break has a first side near the first S/D region of the first nanosheet transistor and near the third S/D region of the second nanosheet transistor and has a second side near the first passive device.

8. The semiconductor structure of claim 1, wherein the single diffusion break is a first single diffusion break, further comprising a second single diffusion break in the passive device region, wherein the first passive device has a first side near the first single diffusion break and a second side near the second single diffusion break.

9. The semiconductor structure of claim 1, wherein the first diffusion region of the first passive device includes a p-type dopant, and the second diffusion region of the first passive device includes an n-type dopant.

10. A method of forming a semiconductor structure comprising:

forming a first, a second, a third, and a fourth stack of nanosheets on a substrate, wherein the first, the second, the third, and the fourth stack of nanosheets each includes a first set of nanosheets and a second set of nanosheets on top of the first set of nanosheets and are separated by a first, a second, and a third recess respectively; the first stack of nanosheets and the first recess are in a passive device region; the second recess, the third stack of nanosheets, the third recess, and the fourth stack of nanosheets are in an active device region; and the passive device region and the active device region are separated by the second stack of nanosheets;

forming a first diffusion region of a first passive device in the first recess; a first source/drain (S/D) region of a first nanosheet transistor in the second recess; and a second S/D region of the first nanosheet transistor in the third recess, wherein the first diffusion region and the first and the second S/D region are adjacent to the first set of nanosheets;

forming a doped region on top of the first diffusion region and an interlevel dielectric (ILD) layer on top of the first and the second S/D region of the first nanosheet transistor; and forming a second diffusion region of the first passive device on top of the doped region; a third S/D region of a second nanosheet transistor on top of the first S/D region of the first nanosheet transistor; and a fourth S/D region of the second nanosheet transistor on top of the second S/D region of the first nanosheet transistor, wherein the active device region and the passive device region are separated by a first single diffusion break; wherein the first and the second diffusion region are vertically separated by the doped region; and wherein the third and the fourth S/D region of the second nanosheet transistor are separated from the first and the second S/D region, respectively, of the first nanosheet transistor by the ILD layer.

11. The method of claim 10, wherein the first diffusion region and the first and the second S/D region of the first nanosheet transistor are formed through a first epitaxial growing process, and the second diffusion region and the third and the fourth S/D region are formed through a second epitaxial growing process.

12. The method of claim 10, further comprising selectively removing the second stack of nanosheets to create an opening and subsequently filling the opening with a dielectric material to form the first single diffusion break that separates the passive device region from the active device region.

13. The method of claim 10, further comprising forming a first, a second, and a third placeholder respectively in the first recess between the first and the second stack of nanosheets, in the second recess between the second and the third stack of nanosheets, and in the third recess between the third and the fourth stack of nanosheets, the first, the second, and the third placeholder being embedded in the substrate.

14. The method of claim 13, further comprising forming a first and a second direct backside contact (BSCA) from a backside of the substrate by removing the first and the third placeholder underneath the first diffusion region and the second S/D region of the first nanosheet transistor to create a first and a second opening and filling the first and the second opening with a conductive material to form the first and the second direct BSCA.

15. The method of claim 10, further comprising forming a first, a second, and a third middle-of-line (MOL) contact, wherein the first MOL contact contacting the second diffusion region of the first passive device, the second MOL contact contacting both the first S/D region of the first nanosheet transistor and the third S/D region of the second nanosheet transistor, and the third MOL contact contacting the fourth S/D region of the second nanosheet transistor.

16. The method of claim 10, further comprising replacing the first and the second set of nanosheets of the third stack of nanosheets with a gate metal in a replacement-metal-gate (RMG) process.

17. A semiconductor structure comprising:

an active device region and a passive device region, the active device region and the passive device region being separated by a single diffusion break, wherein the passive device region includes a first passive device that includes a first diffusion region and a second diffusion region, the first and the second diffusion region being vertically separated by a doped region, and wherein the active device region includes a first nanosheet transistor with a first and a second source/drain (S/D) region and the active device region further includes a second nanosheet transistor with a third and a fourth S/D region, wherein the third and the fourth S/D region of the second nanosheet transistor are separated from the first and the second S/D region, respectively, of the first nanosheet transistor by a first interlevel dielectric (ILD) layer.

18. The semiconductor structure of claim 17, wherein the first diffusion region of the first passive device is connected to a backside power distribution network (BSPDN) through a first direct backside contact (BSCA) and the second diffusion region of the first passive device is connected to a back-end-of-line (BEOL) structure through a first middle-of-line (MOL) contact.

19. The semiconductor structure of claim 17, wherein a top surface of the first diffusion region of the first passive device is substantially co-planar with a top surface of the first S/D region of the first nanosheet transistor and the first diffusion region is made of a substantially same material as the first S/D region of the first nanosheet transistor.

20. The semiconductor structure of claim 17, wherein a top surface of the second diffusion region of the first passive device is substantially co-planar with a top surface of the third S/D region of the second nanosheet transistor and the second diffusion region is made of a substantially same material as the third S/D region of the second nanosheet transistor.

* * * * *